United States Patent
Ito et al.

(10) Patent No.: US 8,007,588 B2
(45) Date of Patent: Aug. 30, 2011

(54) VAPOR-PHASE EPITAXIAL GROWTH METHOD AND VAPOR-PHASE EPITAXY APPARATUS

(75) Inventors: Hideki Ito, Shizuoka (JP); Satoshi Inada, Fukushima (JP); Yoshikazu Moriyama, Shizuoka (JP)

(73) Assignee: NuFlare Technology, Inc., Shizuoka (JP)

( * ) Notice: Subject to any disclaimer, the term of this patent is extended or adjusted under 35 U.S.C. 154(b) by 408 days.

(21) Appl. No.: 11/725,467

(22) Filed: Mar. 20, 2007

(65) Prior Publication Data

US 2007/0218664 A1 Sep. 20, 2007

(30) Foreign Application Priority Data

Mar. 20, 2006 (JP) ................................. 2006-075894

(51) Int. Cl.
*C30B 21/04* (2006.01)
(52) U.S. Cl. .............. 117/89; 117/93; 117/98; 117/102; 117/105; 438/478
(58) Field of Classification Search .................... 117/89, 117/93, 98, 102, 105
See application file for complete search history.

(56) References Cited

U.S. PATENT DOCUMENTS

| | | | | |
|---|---|---|---|---|
| 4,462,847 A | * | 7/1984 | Thompson et al. | 438/353 |
| 5,079,875 A | * | 1/1992 | Unno et al. | 451/541 |
| 5,392,730 A | * | 2/1995 | Kondo et al. | 117/102 |
| 5,645,646 A | | 7/1997 | Beinglass et al. | |
| 5,904,769 A | | 5/1999 | Ohashi et al. | |
| 6,086,673 A | * | 7/2000 | Molnar | 117/90 |
| 6,488,771 B1 | * | 12/2002 | Powell et al. | 117/89 |
| 2002/0106842 A1 | * | 8/2002 | Neudeck et al. | 438/151 |
| 2007/0023869 A1 | | 2/2007 | Furutani et al. | |
| 2007/0026148 A1 | | 2/2007 | Arai et al. | |
| 2008/0289575 A1 | * | 11/2008 | Burrows et al. | 118/715 |

FOREIGN PATENT DOCUMENTS

| | | |
|---|---|---|
| JP | 09-194296 | 7/1997 |
| JP | 2004-327761 | 11/2004 |
| KR | 10-2006-0002975 | 1/2006 |

OTHER PUBLICATIONS

Office Action issued by the Korean Patent Office on Mar. 26, 2008, for Korean Patent Application No. 10-2007-0025411, and English-language translation thereof.
First Office Action issued by the Chinese Patent Office for Chinese Patent Application No. 2007100887320, and English-language translation thereof.
Second Office Action mailed May 8, 2009, from the State Intellectual Property Office of the People's Republic of China for Chinese Application No. 200710088732.0, and English language translation thereof.

* cited by examiner

*Primary Examiner* — Bob M Kunemund
(74) *Attorney, Agent, or Firm* — Finnegan, Henderson, Farabow, Garrett & Dunner, L.L.P.

(57) ABSTRACT

A vapor phase epitaxial growth method using a vapor phase epitaxy apparatus having a chamber, a support structure holding thereon a substrate in the chamber, a first flow path supplying a reactant gas for film formation on the substrate and a second flow path for exhaust of the gas, said method includes rotating the substrate, supplying the reactant gas and a carrier gas to thereby perform vapor-phase epitaxial growth of a semiconductor film on the substrate, and during the vapor-phase epitaxial growth of the semiconductor film on the substrate, controlling process parameters to make said semiconductor film uniform in thickness, said process parameters including flow rates and concentrations of the reactant gas and the carrier gas, a degree of vacuum within said chamber, a temperature of the substrate, and a rotation speed of said substrate.

7 Claims, 19 Drawing Sheets

US 8,007,588 B2

VAPOR-PHASE EPITAXIAL GROWTH METHOD AND VAPOR-PHASE EPITAXY APPARATUS

CROSS-REFERENCE TO RELATED APPLICATION(S)

Priority is claimed to Japanese Patent Application (JPA) No. 2006-075894, filed Mar. 20, 2006, the disclosure of which is incorporated herein by reference.

FIELD OF THE INVENTION

The present invention relates generally to vapor-phase epitaxy (VPE) technologies and, more particularly, to a method and apparatus for forming an epitaxial film grown on a wafer or substrate with controlled growth conditions. This invention also relates to a wafer holder structure adaptable for use in the VPE apparatus.

DESCRIPTION OF RELATED ART

Single-crystal epitaxy techniques with well controlled impurity concentration and film thickness is becoming important more and more in the manufacture of advanced semiconductor devices of enhanced performance, such as ultrahigh-speed bipolar and complementary metal oxide semiconductor (CMOS) transistors.

Epitaxy is typically a process to grow a single-crystalline layer or film on a semiconductive substrate such as a silicon wafer, and is achieved chiefly from vapor phase, rather than solid phase and liquid phase. Usually, vapor-phase epitaxy (VPE) of a silicon film employs atmospheric pressure chemical vapor deposition (APCVD) techniques. In some cases, it uses low pressure chemical vapor deposition (LPCVD)—namely, low pressure VPE (LPVPE). To form such Si epitaxial film, place a semiconductor substrate, e.g., a silicon wafer, in the growth reactor chamber of a VPE system. Then, heat and rotate the wafer while retaining the interior of the chamber in an environment of atmospheric pressure (0.1 MPa or 760 Torr) or in a specified degree of vacuum. A raw gas is then supplied into the chamber. This gas contains a silicon source and a chosen dopant, such as compounds of boron (B), arsenic (As) or phosphorus (P). Next, perform either thermal decomposition or hydrogen reduction reaction at the surface of the heated wafer to thereby grow and form a B, P or As impurity-doped silicon epitaxial thin-film. The process above is disclosed, for example, in JP-A-9-194296.

The epitaxial growth technique is also used in the manufacture of other types of devices, such as for IS example insulated-gate bipolar transistors (IGBTs). In the power semiconductor circuit elements such as IGBTs or else, a need is felt to form a silicon epitaxial film having a thickness of several tens of μm or greater.

FIG. 38 shows a top view of an exemplary holder structure with a silicon wafer being supported thereon. A sectional view of the wafer holder is shown in FIG. 39. As shown, the holder (also called the susceptor) 500 for use as a supporting member of Si wafer 500 has a counter-bored opening with a diameter slightly larger than that of Si wafer 500. This wafer 500 is mounted so that it is received in the counterbored hole. In this state, the holder 510 is driven to rotate to thereby rotate Si wafer 500, permitting growth of a Si epitaxial film by either thermal decomposition or hydrogen reduction reaction of a raw gas supplied thereto.

When the silicon wafer 500 is rotated which is placed on the holder 510 having a counterbored hole with its diameter little larger than the diameter of Si wafer 500, this wafer tends to move in a direction parallel with the surface thereof due to the presence of a centrifugal force as created by the rotation, resulting in the wafer being offset toward part of a sideface of the hole. Here, in the case of forming a silicon epitaxial film to a thickness of several tens of μm, e.g., 50 μm or more, required for the manufacture of a power semiconductor circuit element such as IGBT, the holder 510 can experience unwanted contact between the Si epitaxial film thus grown on the sideface part of wafer 500 and a film deposited on the sideface of the hole. This results in tight contact or "adhesion," which leads to occurrence of a program that the Si wafer 500 is rigidly adhered to the holder 510 accidentally during conveyance of this wafer.

The inventors as named herein have filed Japanese patent application Nos. 2006-110533 and 2006-192098 for our inventions regarding VPE processes using counterbored wafer holder structures and wafer supporting techniques, the contents of which are incorporated herein.

Unfortunately, even with the use of the above-stated approaches, the silicon epitaxial film as grown at peripheral surface portions of the silicon wafer 500 can become thinner, resulting in the film thickness being made irregular to loose the uniformity. In some cases, such peripheral portions and their nearby portions of the wafer are scrapped as defective products. This appreciably reduces the production yield of semiconductor integrated circuit chips per wafer.

BRIEF SUMMARY OF THE INVENTION

It is therefore an object of this invention to provide an improved vapor-phase epitaxy (VPE) technique capable of uniformizing the thickness of an epitaxially grown semiconductor layer or film while appropriately controlling epitaxial growth conditions.

To attain the foregoing object, a VPE method in accordance with one aspect of this invention is a process which uses an epitaxy apparatus having a growth reactor chamber, a rotatable support structure holding thereon a substrate to be processed, a gas inflow path and a gas outflow path. The method includes the steps of driving the support structure to rotate the substrate, and feeding a reactant gas and a carrier gas via the gas inflow path onto the substrate, thereby to perform vapor-phase epitaxial growth of a semiconductor film on the substrate. During the epitaxial growth of this film, process parameters are controlled to make the film uniform in thickness. These process parameters typically include the flow rates of the reactant and carrier gases, the concentration of each gas, the degree of vacuum in the chamber, the temperature of substrate, and the rotation speed thereof.

The reactant gas is a gas of trichlorosilane whereas the carrier gas is hydrogen. Preferably, the trichlorosilane gas is adjusted to be 8 percent (%) in concentration within the chamber. The internal pressure of this chamber is set at 6.7 to $10.6 \times 10^4$ pascals (Pa). Control is also provided to set the speed of rotation of the substrate to 500 to 1,500 revolutions per minute (rpm) while setting its temperature at 1,100 to 1,140° C. With the setup of these parameters, the semiconductor layer is enabled to grow at a rate of 8 micrometers per minute (μm/min) or greater, resulting in an in-plane thickness distribution of the layer being kept less than or equal to 0.5%.

In accordance with another aspect of the invention, a VPE apparatus includes a reactor chamber with its internal pressure being controlled to fall within a range of from 6.7 to $10.6 \times 10^4$ Pa during film fabrication, a flow path which supplies a mixture of a trichlorosilane gas and a carrier gas into the chamber while letting a concentration of trichlorosilane be controlled to be less than or equal to 8%, a support structure which holds thereon a substrate within the chamber and which is driven to rotate the substrate at a rotation speed of 500 to 1500 rpm during the film fabrication, and a heater module for controlling the temperature of substrate to stay at 1100 to 1140° C. during the film fabrication.

DETAILED DESCRIPTION OF THE INVENTION

Embodiment 1

Figure 1:
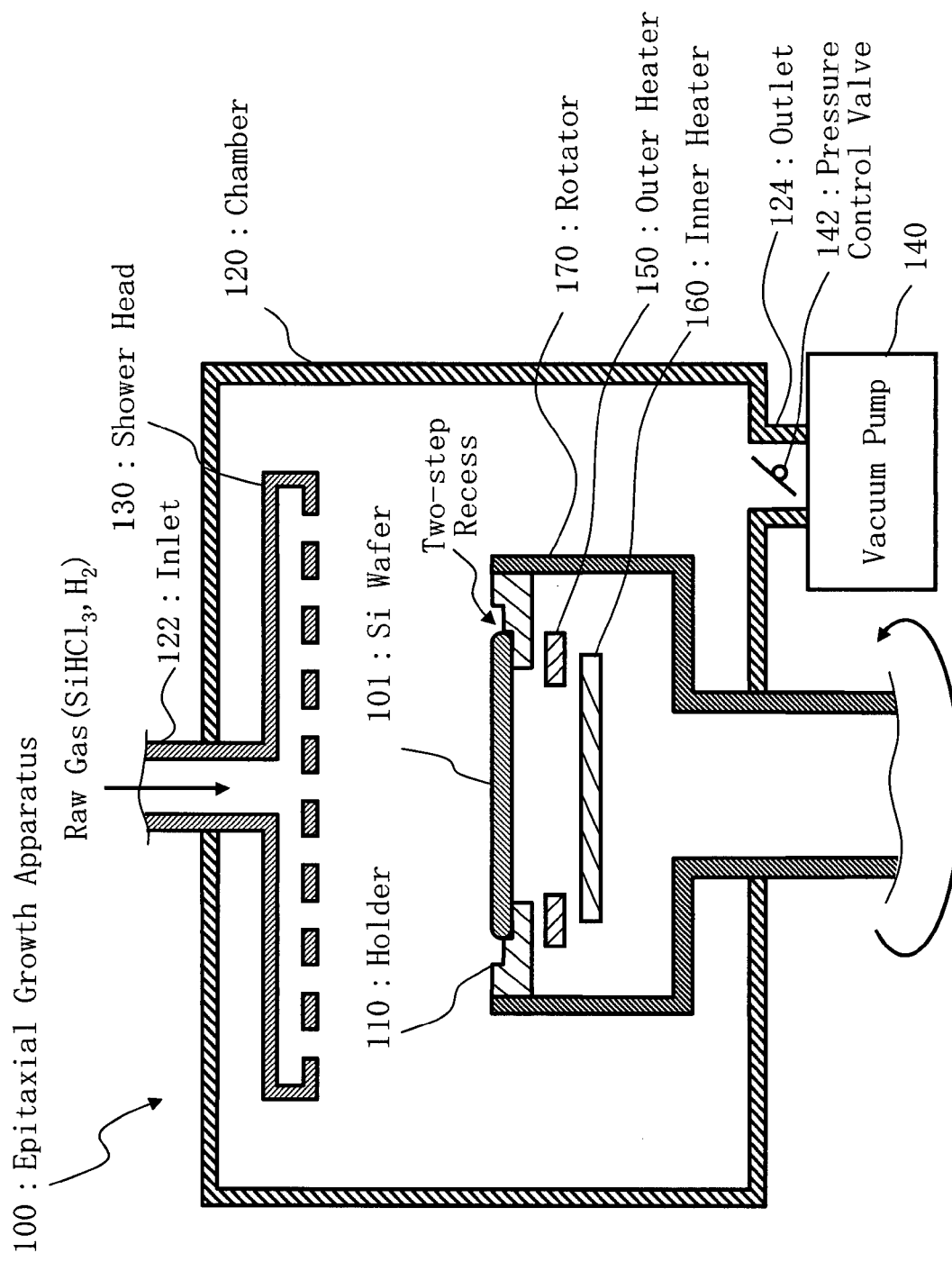
FIG. 1 is a diagram schematically showing, in cross-section, a structure of main part of VPE apparatus in accordance with one embodiment of this invention.

A vapor-phase epitaxy (VPE) apparatus 100 embodying this invention is shown in FIG. 1 with respect to main part thereof. As shown herein, this VPE tool 100 is generally made up of a workpiece support structure 110, also known as holder or susceptor, in the interior space of an epitaxial growth reactor chamber 120. This chamber 120 has a shower head 130, a vacuum pump 140, a gas pressure control valve 142, an outer heater 150, an inner heater 160, and a rotating member 170. The chamber 120 is associated with a gas inflow path 122 and a gas outflow path 124 which are coupled thereto. The gas inlet 122 is coupled to the shower head 130. Note that the illustration here is not to scale for purposes of convenience in illustration. The same goes with respective ones of the other drawings.

The holder 110 is circular in its outer circumference with a through-going opening of a prespecified inside diameter being formed therein. Holder 110 also has a circular recess, or "depressed portion", which is an example of the first recess as claimed. This recess is formed to a first depth from the top surface of holder 110. Also formed therein is a second recess, or "depressed portion". The second recess has its diameter less than that of the first recess and a second depth from a bottom surface of the first recess. The second recess has an annular bottom surface for contact with the backface of a silicon wafer 101, which is an example of the substrate being processed, thereby to support the wafer 101.

The wafer holder 110 is disposed on the rotator 170, which is driven by a rotation mechanism (not shown) to rotate with a center line at right angles to the surface of silicon wafer 101 being as the rotation axis thereof. Rotating the holder 110 together with the rotator 170 at a rotation speed of about 500 to 1,500 revolutions per minute (rpm) causes Si wafer 101 to rotate accordingly at a controlled speed of rotation—preferably, at 900 rpm. This unit "rpm" is equivalent to "turns per minute ($min^{-1}$)" as is known among those skilled in the art.

On the backface side of the wafer holder 110, the outer heater 150 and inner heater 160 are disposed. The outer heater 150 is for heat-up of the outer periphery of the silicon wafer 101 and the holder 110. The inner heater 160 is placed to underlie the outer heater 150, for heating the remaining part of silicon wafer 101 other than its periphery. The wafer is set at a temperature of 1,120° C., as an example. Outer heater 150 is provided in addition to inner heater 160 for heating the outer periphery of Si wafer 101, from which the heat tends to escape toward holder 110. Using the twin heater structure makes it possible to uniformize the in-plane heatup capability of Si wafer 101. Additionally the wafer temperature may be set to fall within a range of 1100 to 1140° C.

The holder 110, outer heater 150, inner heater 160, shower head 130 and rotating member 170 are disposed within the chamber 120. The rotator 170 has a shaft that extends from inside of the chamber 120 toward the rotation mechanism (not shown) external to chamber 120. The shower head 130 has its pipe that extends from inside of chamber 120 to the outside thereof.

The interior space of the chamber 120 for use as a reaction vessel is retained at an atmospheric pressure or, alternatively, is evacuated by the vacuum pump 140 to a prespecified degree of vacuum, e.g., $9.3 \times 10^4$ Pa (700 Torr) or more or less. In this state, the silicon wafer 101 is heated by the outer heater 150 and inner heater 160. Simultaneously, this wafer 101 is rotated at a predetermined rotation speed by the rotation of the holder 110. With control of the process conditions in this way, a raw gas is supplied that becomes the silicon source from the showerhead 130 into the reactor chamber 120. Note here that the degree of vacuum in this chamber may be set at 6.7 to $10.6 \times 10^4$ Pa in the state that the raw gas is being supplied thereto.

Then, perform thermal decomposition or hydrogen reduction reaction of the raw gas on the surface of the heated silicon wafer 101, thereby causing a Si epitaxial film to grow on the wafer surface. The internal pressure of the chamber 120 is adjusted by the pressure control valve 142 to have an atmospheric pressure or a specified degree of vacuum. In the case of the wafer being processed at the atmospheric pressure, the vacuum pump 140 and pressure control valve 142 are eliminatable. The showerhead 130 is arranged to have a plurality of through-holes for draining, by way of an internal buffer of showerhead 130, the raw gas that was fed via the pipe from the outside of chamber 120. This permits the raw gas to be uniformly fed onto the Si wafer 101.

Further, let the internal and external pressures of the holder 110 and rotating member 170 be equalized. In other words, the surface-side atmospheric pressure of silicon wafer 101 and its backface-side atmospheric pressure are made identical to each other. This makes it possible to prevent the raw gas from intruding to either the inside of rotator 170 or to the interior of the rotation mechanism (not shown). It is also possible to avoid leakage of a purge gas or like gases on the rotation mechanism side into the chamber (i.e., the surface-side atmosphere of silicon wafer 101).

An example of the silicon source supplied from the showerhead 130 is a trichlorosilane ($SiHCl_3$) gas that is diluted by hydrogen ($H_2$) to 30% at a flow rate of 51 Pa·$m^3$/sec (30 supplying gas flow (SLM)), which gas is fed with the aid of a carrier gas of $H_2$. The feed amount of the carrier gas is controlled to adjust the concentration of $SiHCl_3$ to be kept within 8% in the entirety of the gas. For example, $H_2$ is supplied at 185 Pa·$m^3$/sec (110SLM), resulting in the density of $SiHCl_3$ being set to about 7%. Then, set the inner heater 160 at 1100° C. while setting the outer heater 150 to 1098° C. The rotation speed of silicon wafer 101 is set to 500 to 1500 rpm ($min^{-1}$). The internal pressure of chamber 120 is at $9.3 \times 10^4$ Pa (700 Torr). With the setup of these process conditions, it is possible to grow a semiconductor layer at a growth rate of 8 μm/min or greater. It is also possible to limit the inplane film thickness distribution on the surface of such semiconductor layer to 0.5% or less. Additionally, use of the process conditions makes it possible to form a silicon epitaxial film with a thickness of several tens of μm or more—e.g., 50 μm. This thickness value is required for the manufacture of power semiconductor circuit elements, such as IGBTs. As for the inplane film thickness distribution, 0.49% is attainable.

Figure 2:
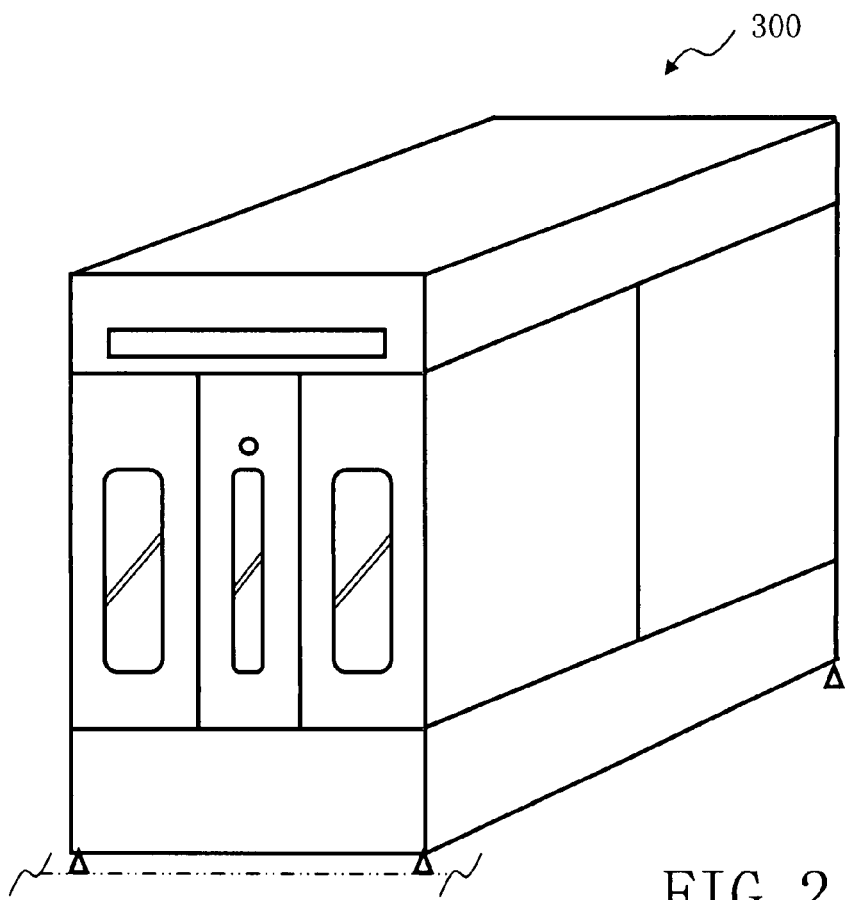
FIG. 2 is a diagram showing a perspective view of a VPE system using the apparatus of FIG. 1.

FIG. 2 shows one example of the exterior appearance of an epitaxial growth system 300 using the VPE apparatus 100. As shown herein, this epitaxy system 300 is contained in a housing.

Figure 3:
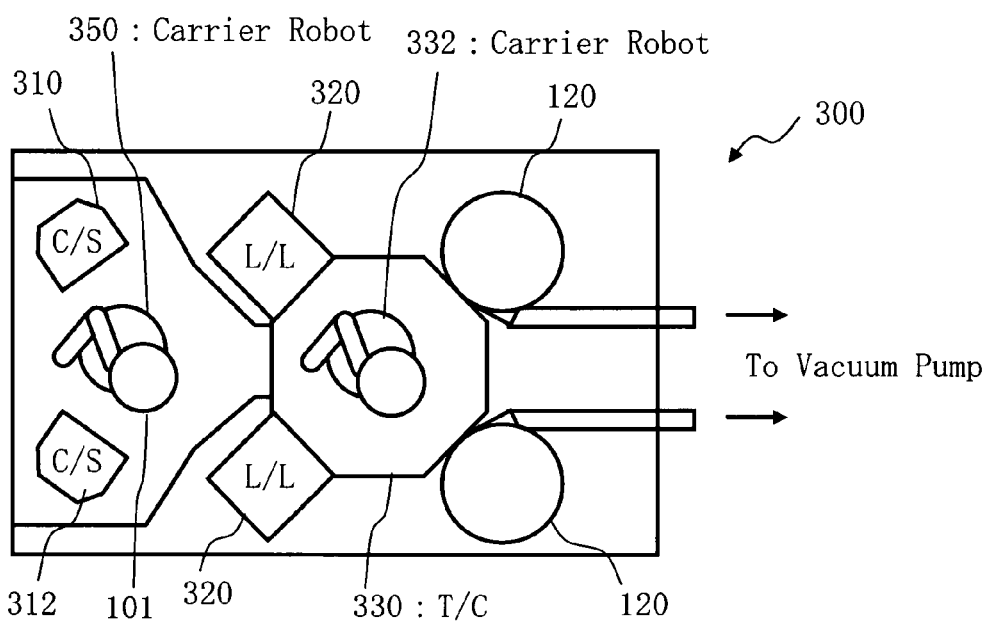
FIG. 3 depicts an exemplary unit configuration of the VPE system using the apparatus.

An exemplary structure of one unit of the epitaxy system 300 is shown in FIG. 3. Within this system, a number of silicon wafers 101 are set in a cassette as disposed at a cassette stage (C/S) 310 or 312. The silicon wafers 101 as set therein are then transported, one at a time, by a conveyance robot 350 into a load lock (L/L) chamber 320. Then, another conveyance robot 332 that is disposed within a transfer chamber 330 is rendered operative to convey a silicon wafer 101 from the L/L chamber 320 into the transfer chamber 330. The Si wafer 101 conveyed is transported to the interior of the reactor chamber 120 of the epitaxial growth apparatus 100, followed by forming of a silicon epitaxial film on the top surface of Si wafer 101 by VPE techniques. This wafer 101 with the epitaxial film formed thereon is again taken out by the conveyance robot 332 from the epitaxy apparatus 100 to the interior of transfer chamber 330.

The silicon wafer 101 thus taken out is then transported to the L/L chamber 320. Thereafter, it is returned by the conveyance robot 350 from the L/L chamber 320 to the cassette that is disposed at the C/S 310 or 312. The epitaxy system 300 shown in FIG. 3 is arranged to have a couple of reactor chambers 120 of VPE apparatus 100 and two L/L chambers 320 for improvement of throughputs.

Figure 4:
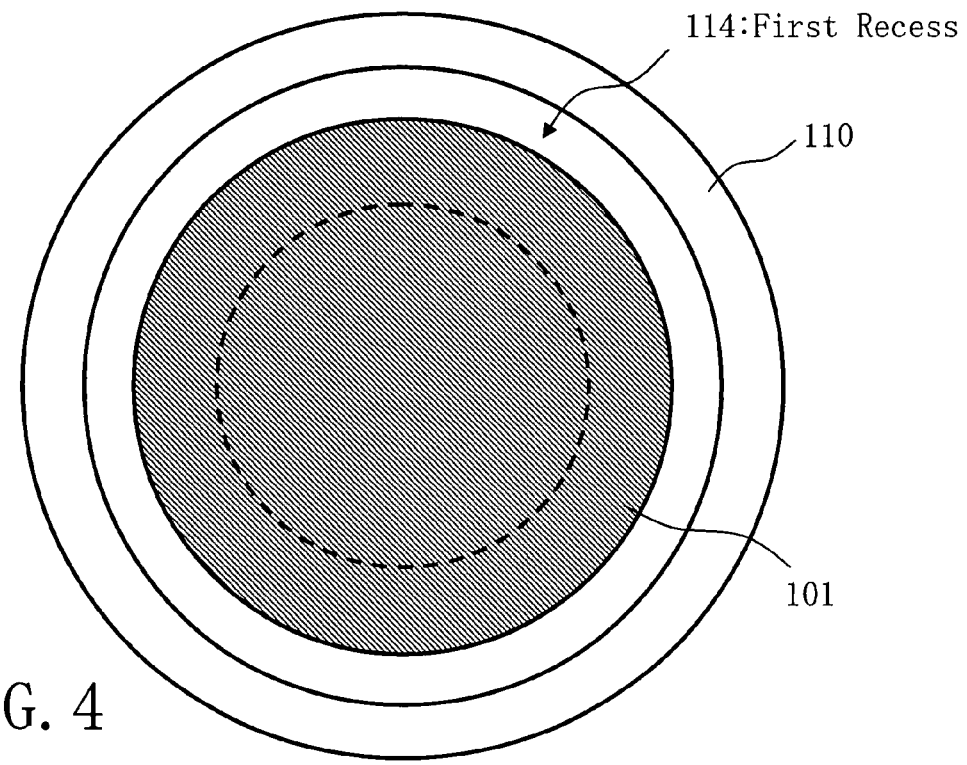
FIG. 4 is a top plan view of a wafer holder structure supporting thereon a silicon wafer in the FIG. 1 apparatus.
Figure 5:
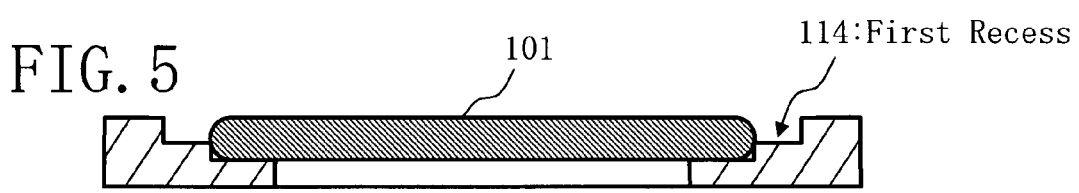
FIG. 5 is a cross-sectional view of the wafer holder of FIG. 4 with the wafer being mounted thereon.

A top plan view of one example of the wafer holder 110 with a silicon wafer supported thereon is shown in FIG. 4. Its sectional view is shown in FIG. 5. As shown herein, this wafer holder 110 is a round disc-like plate as a whole and has a two-step recess as formed therein. This two-step recess consists essentially of a first circular countersunk-like recess 114, or "depressed portion 114" which has a diameter larger than that of the silicon wafer 101 and a depth of more than one-half of the thickness of Si wafer 101, and a second round recess 116 that has its diameter slightly larger than that of Si wafer 101 and yet smaller than that of the first recess 114. The second recess 116, or "depressed portion 116" is formed in an annular bottom surface of first recess 114 to a depth less than one-half of the thickness of wafer 101. Second recess 116 has at its center a through-going hole to thereby provide its own annular bottom face or "shelf" to be contacted with the backface of Si wafer 101 as better shown in FIG. 5.

The silicon wafer 101 is supported by the holder 110 in a way such that its backface is on the bottom surface of the second counterbore-like recess 116. Upon rotation of the holder 110, the Si wafer 101 can move or offset in the parallel direction to its surface due to the application of a centrifugal force thereof. If this is the case, an upper edge portion of sideface of the second recess 116 comes into contact with Si wafer 101 at its lower surface portion of a bevel part of the outer circumference of wafer 101. This makes it possible to suppress unwanted detachment of Si wafer 101. Even if Si wafer 101 is moved to ride over and go beyond the upper edge portion of the sideface of the second recess 116, the first recess 114's sideface impinges with the sideface of wafer 101. Thus it is possible to prevent accidental detachment of Si wafer 101 from the holder 110.

It has been stated that the wafer holder 110 has the first countersunk-like recess 114 and the second recess 116 in the bottom of the first recess 114. The second recess 116 is formed to a specific depth which is less than the thickness of the silicon wafer 101. The depth of the first recess 114 is arranged to be less than the thickness of Si wafer 101. With such arrangement, it is possible to make uniform the flow of a gas or gases as fed from the inflow path 122 onto Si wafer 101. In addition, by forming a semiconductor film under the above-stated process conditions, it is possible to cause the film to stay within 0.5% in its in-plane thickness distribution on the wafer surface.

Preferably, the second recess 116 is applied anti-skid treatment on its bottom surface. By applying such untiskid processing to the bottom face of second recess 116, it is possible to increase the frictional force between the backface of the silicon wafer 101 and the bottom face of second recess 116. An example of the untiskid processing is blast treatment. Another example is to form thereon a rugged surface configuration resembling the cutting ridges or teeth of a file. Increasing the frictional force between the wafer backface and the recess bottom face makes it possible to restrain detachment of the Si wafer 101 from the holder 110.

Figure 6:
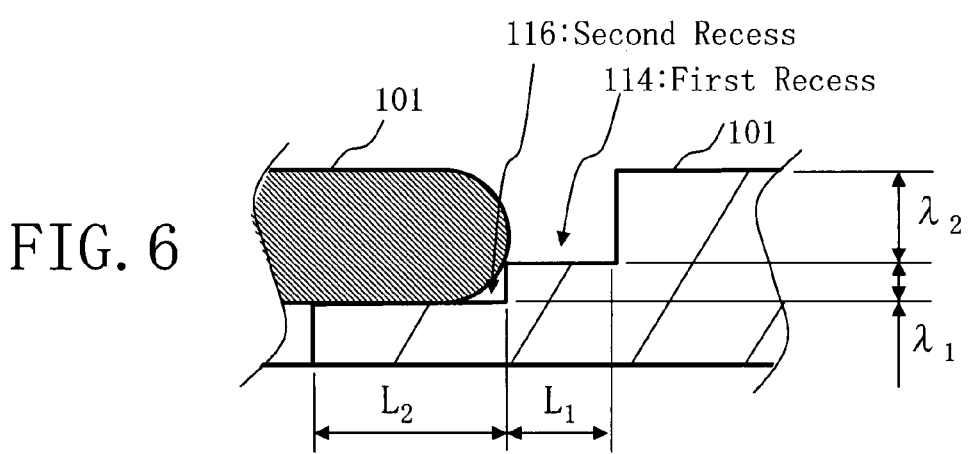
FIG. 6 is an enlarged sectional view of part of the holder along with a peripheral portion of the wafer thereon.

See FIG. 6, which is an enlarged sectional view of a part of the wafer holder 110 including edges of the first and second recesses 114 and 116 along with an outer peripheral portion of the silicon wafer 101 as mounted on this holder. As shown herein, it is desirable that the second recess 116 be designed to have its digging depth $\lambda 1$ so that the height of the bottom face of the first recess 114 is positioned on lower side of the bevel part of silicon wafer 101. Preferably the size $\lambda 1$ is about 20% to 40% of the thickness of Si wafer 101.

An example is that in the case of a silicon wafer with its diameter of 200 mm and a thickness t of 0.725 mm, the recess depth $\lambda 1$ is equal to 0.2 plus/minus ($\pm$) 0.05 mm. A digging depth $\lambda 2$ of the first recess 114 is preferably set at 50 to 60% of the thickness of Si wafer 101—for example, 0.4±0.05 mm. Desirably the ratio of $\lambda 1$ to $\lambda 2$ is 1:2, or nearly equal thereto. A length L2 along the radius of the bottom face of the second recess 116 that is in contact with the backface of Si wafer 101 to thereby support it thereon is set at 1 to 4 mm, which is little larger than that in the prior art.

Additionally, a length L1 along the radius of the bottom face of the first recess 114 is set to more than twice the thickness of a silicon epitaxial film to be formed on the silicon wafer 101 by using the raw gas. For example, in the case of such Si epi-film being formed to a thickness of 120 μm, the length L1 is preferably 240 μm (0.24 mm) or greater. With this length setting, it is possible to avoid unwanted contact of a film that grows from the sideface of Si wafer 101 with a film that grows toward the wafer side. For example, L1 is set to 1 mm.

Figure 7:
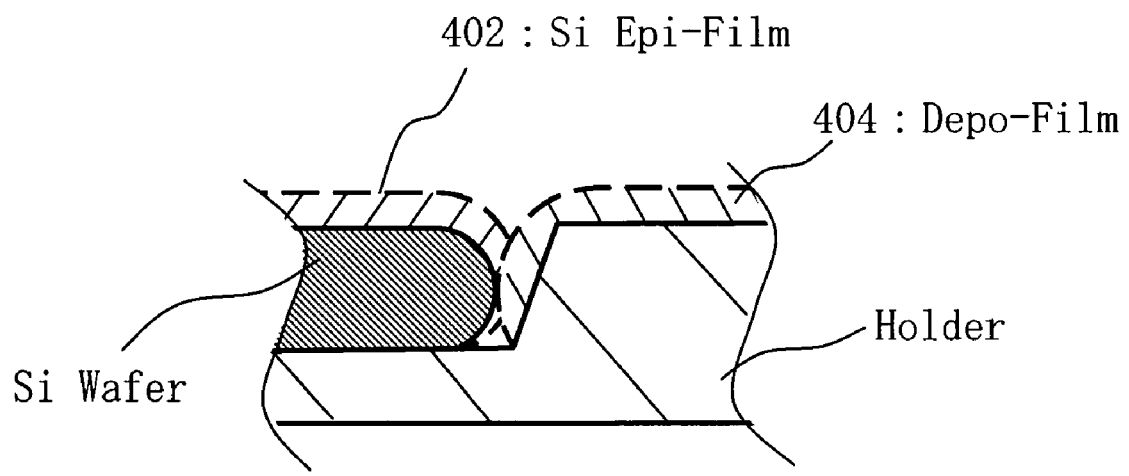
FIG. 7 shows a partial sectional view of a wafer holder of the type having no stepwise recesses and peripheral part of a silicon wafer in the state that an epitaxial film is formed thereon.
Figure 8:
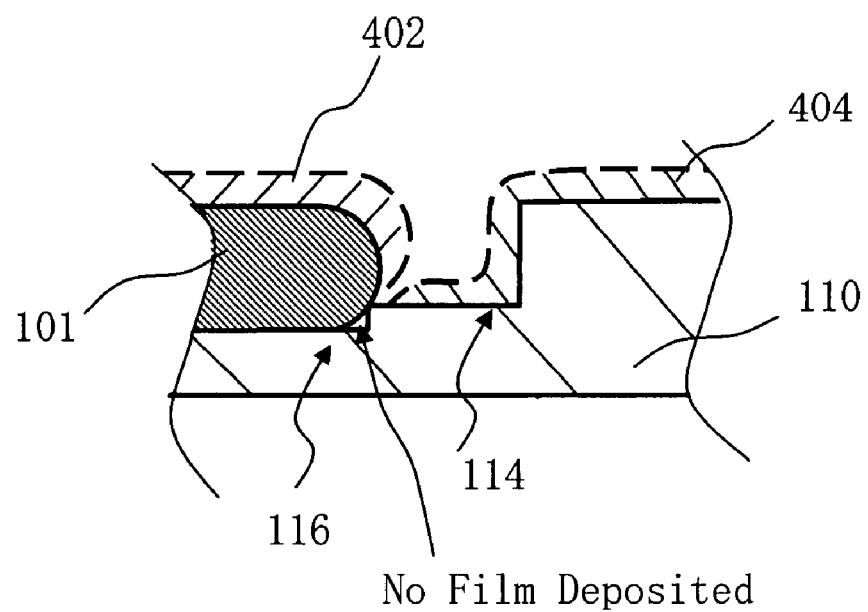
FIG. 8 is a partial sectional view of a stepwise recess-formed holder as used in the FIG. 1 apparatus and its corresponding peripheral part of a silicon wafer in the state that an epitaxial film is formed thereon.

An exemplary state of a film as formed using a wafer holder that does not have the two-step recess structure but has a mere inclined flat sideface is illustrated in FIG. 7 in cross-section, whereas a film formed using the wafer holder 110 having the two-step recess structure of the embodiment is shown in FIG. 8. As shown in FIG. 7, in the case of the holder that lacks the two-step recess design, a silicon epitaxial film 402 that was grown at sideface part of the silicon wafer comes into contact with a depo-film 404 that is deposited on the slant recess sideface of the holder. These films can be adhered or "bonded" together, resulting in adhesion of Si wafer to the holder.

In contrast, as shown in FIG. 8, in the case of using the wafer holder 110 having the two-step counterbored recess design of this embodiment, when the holder 110 rotates to cause the silicon wafer 101 to move in the parallel direction with the wafer surface due to application of the rotation-occurred centrifugal force, the upper end portion of sideface of the second recess 116 is brought into contact with a lower surface portion of the bevel part of the outer periphery of Si wafer 101. This results in the bevel acting as a protective cover or "roof" for preventing or suppressing unwanted deposition of the depo-film 404. As a result, at such the contact portion, the films are no longer adhered together; alternatively, even if these are adhered, the adhesion is minimal. Thus it is possible to avoid tight adhesion of Si wafer 101 and holder 110.

Furthermore, a groove that is surrounded by the sideface of the first recess 114 is created by first recess 114 around the silicon wafer 101. Providing such groove makes it possible to reduce the deposition amount of the depo-film at the bottom of this groove.

Embodiment 2

Figure 9:
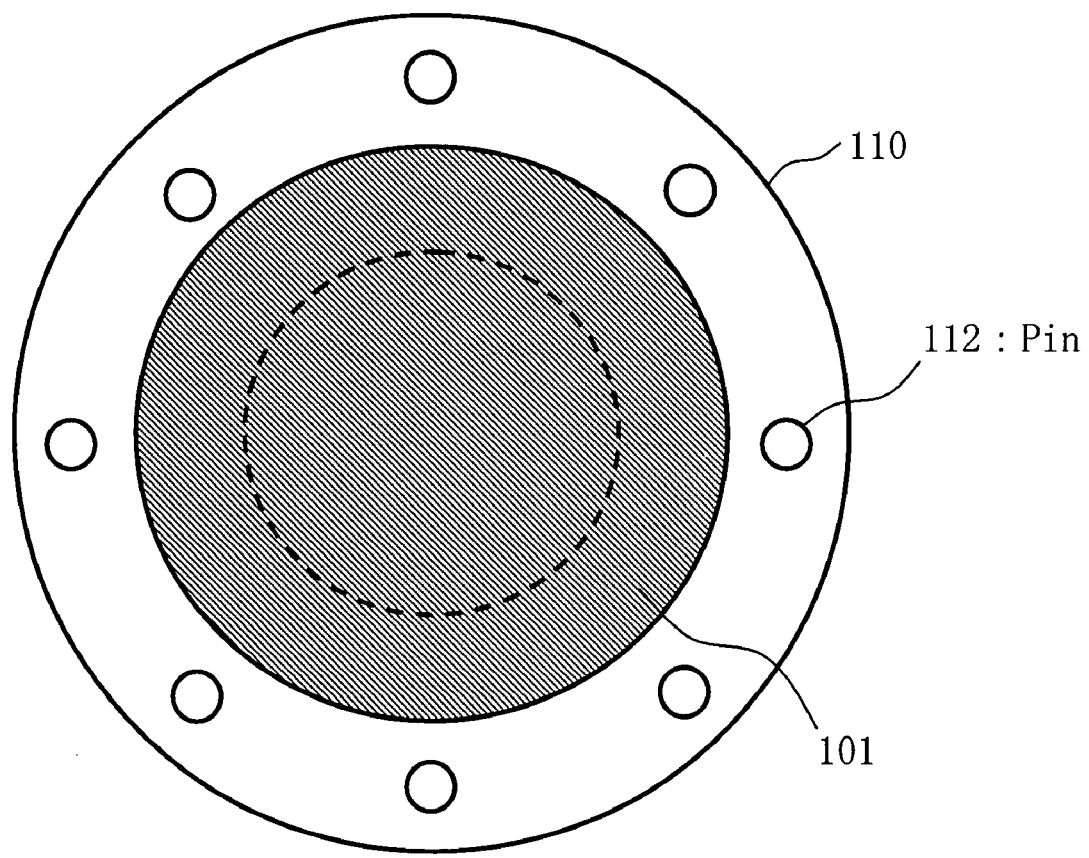
FIG. 9 is a top plan view of another exemplary wafer holder with a silicon wafer being situated thereon.
Figure 10:
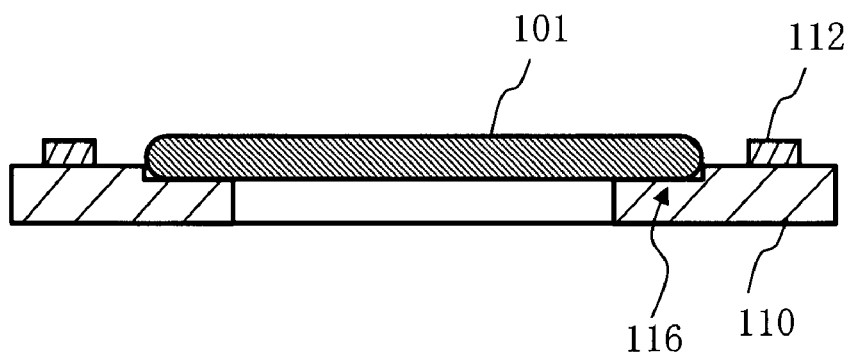
FIG. 10 is a cross-sectional view of the holder of FIG. 9 supporting thereon the silicon wafer.

Turning to FIG. 9, a top plan view of a wafer holder 110 in accordance with another embodiment of this invention is shown in the state that a silicon wafer 101 is mounted and supported thereby. A sectional view of the holder 110 is depicted in FIG. 10. In this embodiment, an annular array of multiple upstanding pins 112 is disposed as an alternative to the forming of the internal recess 114 shown in FIG. 4. VPE process conditions are similar to those of the previous embodiment. As shown in FIG. 9, the holder 110 has a circular recess 116, or "depressed portion 116" corresponding to the outer large-diameter recess of FIG. 4. This "second" recess 116 is slightly larger in diameter than the Si wafer 101 and has a depth that is less than one-half of the thickness of Si wafer 101. Holder 110 also has a through-hole at the center of a bottom surface of recess 116, which hole is less in diameter than wafer 101. Si wafer 101 is mounted and supported on an annular bottom surface of the second recess 116. The holder 110 has a ring-like flat top surface, on which more than three pins 112 are laid out at equal intervals along a circle on the holder surface as better shown in FIG. 9.

In FIG. 9, eight equal-spaced pins 112 are disposed, for example. Upon rotation of the holder 110, the silicon wafer 101 can move in the parallel direction to its surface due to the application of a centrifugal force thereof. If this is the case, an upper edge portion of sideface of the second recess 116 comes into contact with Si wafer 101 at its lower surface portion of a bevel part of the outer periphery of wafer 101. This makes it possible to suppress unwanted detachment of Si wafer 101. Even if wafer 101 is moved to ride over and go beyond the upper edge portion of the sideface of the second recess 116, the sideface of Si wafer 101 comes into contact with one or some of the more than three (here, eight) pins 112. Thus it is possible to suppress unwanted detachment of wafer 101.

As in the embodiment holder shown in FIGS. 4-6, when the holder 110 rotates to cause the silicon wafer 101 to move in the parallel direction with the wafer surface due to application of the rotation-occurred centrifugal force, the upper end portion of the sideface of the second recess 116 is brought into contact with a lower surface portion of the bevel part of the outer periphery of Si wafer 101. This results in the bevel acting as a roof for preventing or suppressing unintentional deposition of a film. Hence, film adhesion no longer takes place at the contact location. Thus it is possible to avoid unwanted adhesion of Si wafer 101 to holder 110.

Embodiment 3

Figure 11:
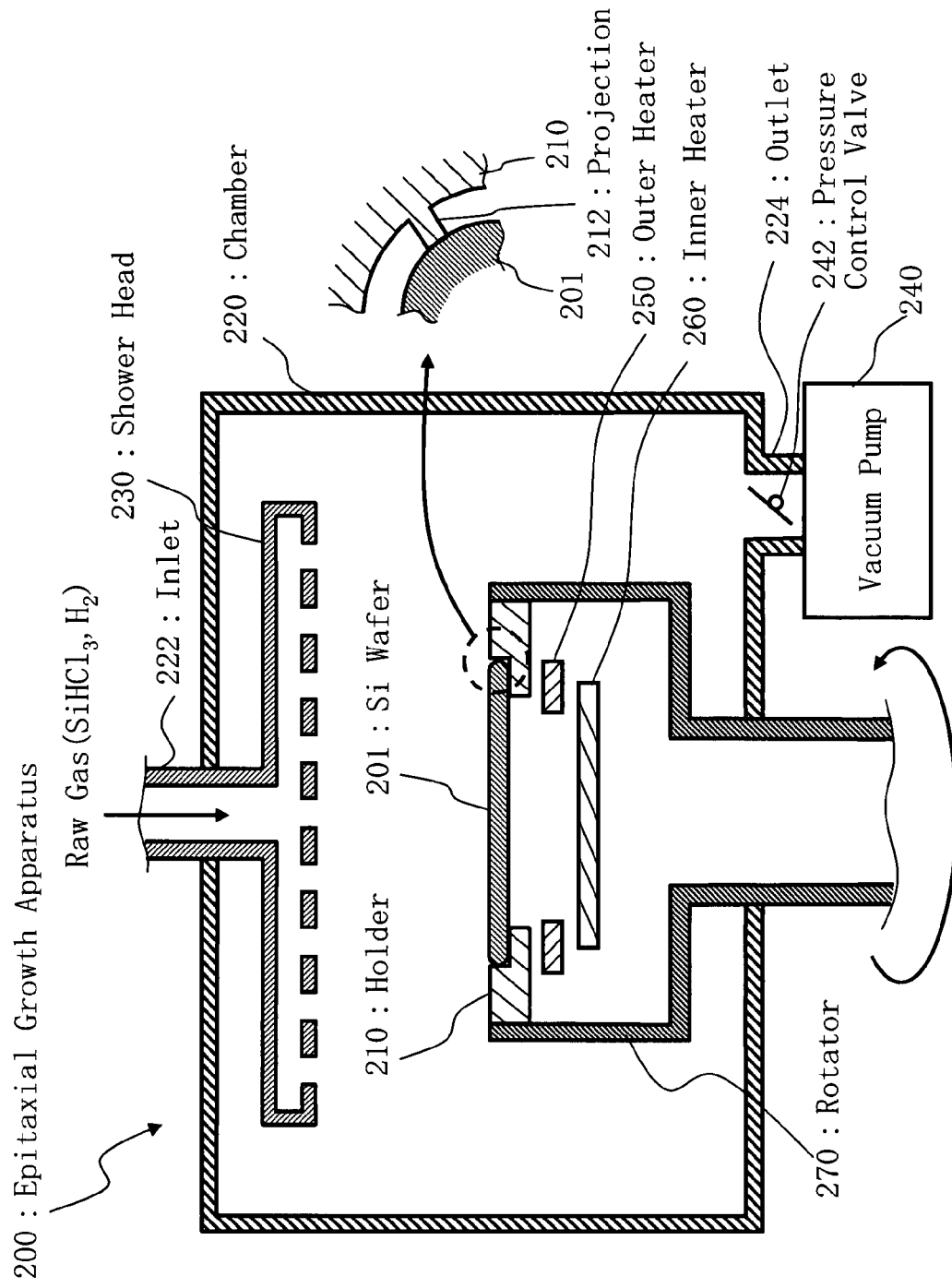
FIG. 11 illustrates, in cross-section, a structure of main part of VPE apparatus in accordance with another embodiment of the invention.

A vapor-phase epitaxy (VPE) apparatus 200 also embodying this invention is shown in FIG. 11. As in the embodiment of FIG. 1, this VPE tool 100 includes a substrate support holder 210, also known as susceptor, in the interior space of a growth reactor chamber 220. This chamber 220 has a shower head 230, a vacuum pump 240, a gas pressure control valve 242, an outer heater 250, an inner heater 260, and a rotating member 270. The chamber 220 is associated with a gas inflow path 222 and a gas outflow path 224 which are coupled thereto. The gas inlet 222 is coupled to the showerhead 230.

The holder 210 has a circular shape in its outer circumference, with a through-hole of a predetermined internal diameter being centrally formed therein—i.e., it is a hollow ring-like plate with a center hole. The holder 210 has in the hole a recess, or "depressed portion" with an annular flat bottom surface at a mid level or "depth" from the top surface of holder 210, and supports a semiconductor substrate—here, a silicon wafer 201—by contact of the back surface of Si wafer 201 with the mid-level recess surface. A plurality of spaced-apart raised portions 212—say, first projections—are formed on the annular mid-level surface coupled to a cylindrical inner wall of the recess in a way such that these encompass the Si wafer 201 for restraining its movement or displacement in a substantially horizontal direction parallel to the surface of wafer 201. The first projections 212 extend inward along radial directions, on the horizontal plane, from the inner wall toward the center of the holder 210.

The holder 210 is disposed on the rotator 270, which is driven by a rotation mechanism (not shown) to rotate with a center line perpendicular to the surface of the silicon wafer 201 being as the rotation axis thereof. Rotating the holder 210 together with the rotator 270 causes Si wafer 201 to rotate accordingly at a controlled speed of rotation—preferably, at 900 rpm ($min^{-1}$).

Note that in this embodiment also, the rotation speed is preferably set to range from 500 to 1500 rpm ($min^-$).

On the backface side of the holder 210, the outer heater 250 and inner heater 260 are disposed. The outer heater 250 is for heating the outer periphery of the silicon wafer 201 and the holder 210. The inner heater 260 is situated beneath the outer heater 250, for heating the remaining part of Si wafer 201 other than its periphery. The outer heater 250 is provided in addition to the inner heater 260 for heatup of the outer periphery of Si wafer 201, from which the heat behaves to escape toward holder 210, to thereby provide a twin heater module which enables uniformization of the inplane heatup of Si wafer 201.

The holder 210, outer heater 250, inner heater 260, showerhead 230 and rotator 270 are disposed within the chamber 220. The rotator 270 has a shaft that extends from inside of the chamber 220 toward the rotation mechanism (not shown) external to chamber 220. The shower head 230 has its pipe extending from inside of chamber 120 to the outside thereof.

The interior space of the chamber 220 for use as a reaction vessel is held at an atmospheric pressure or, alternatively, is evacuated by the vacuum pump 240 to a prespecified degree of vacuum, e.g., $9.3 \times 10^4$ Pa (700 Torr). In this state, the silicon wafer 201 is heated by the outer heater 250 and inner heater 260. Simultaneously, this wafer 201 is rotated at a predetermined rotation speed by the rotation of the holder 210. With control of these process conditions in this way, supply a raw gas that becomes the silicon source from the showerhead 230 into the reactor chamber 220. The wafer may be set at 1100 to 1150° C.

Then, perform thermal decomposition or hydrogen reduction reaction of the raw gas at the surface of the heated silicon wafer 201, thereby causing a silicon epitaxial film to grow on the wafer surface. The internal pressure of the chamber 220 is adjusted by the pressure control valve 242 to an atmospheric pressure or a specified degree of vacuum, e.g., 8 to $11 \times 10^4$ Pa, as in the first embodiment stated supra. The showerhead 230 is arranged to have a plurality of through-holes for draining, through an internal buffer of showerhead 230, the raw gas that was fed via the pipe from the outside of chamber 220. This permits the raw gas to be uniformly fed onto Si wafer 201.

Additionally, let the internal and external pressures of the holder 210 and the rotating member 270 be equalized. In other words, the surface-side atmospheric pressure of Si wafer 201 and its backface-side atmospheric pressure are made equal to each other. This makes it possible to prevent the raw gas from intruding to either the inside of rotator 270 or into the rotation mechanism (not shown). It is also possible to avoid leakage of a purge gas or the like in the rotation mechanism into the chamber (i.e., the surface-side atmosphere of Si wafer 201).

Figure 12:
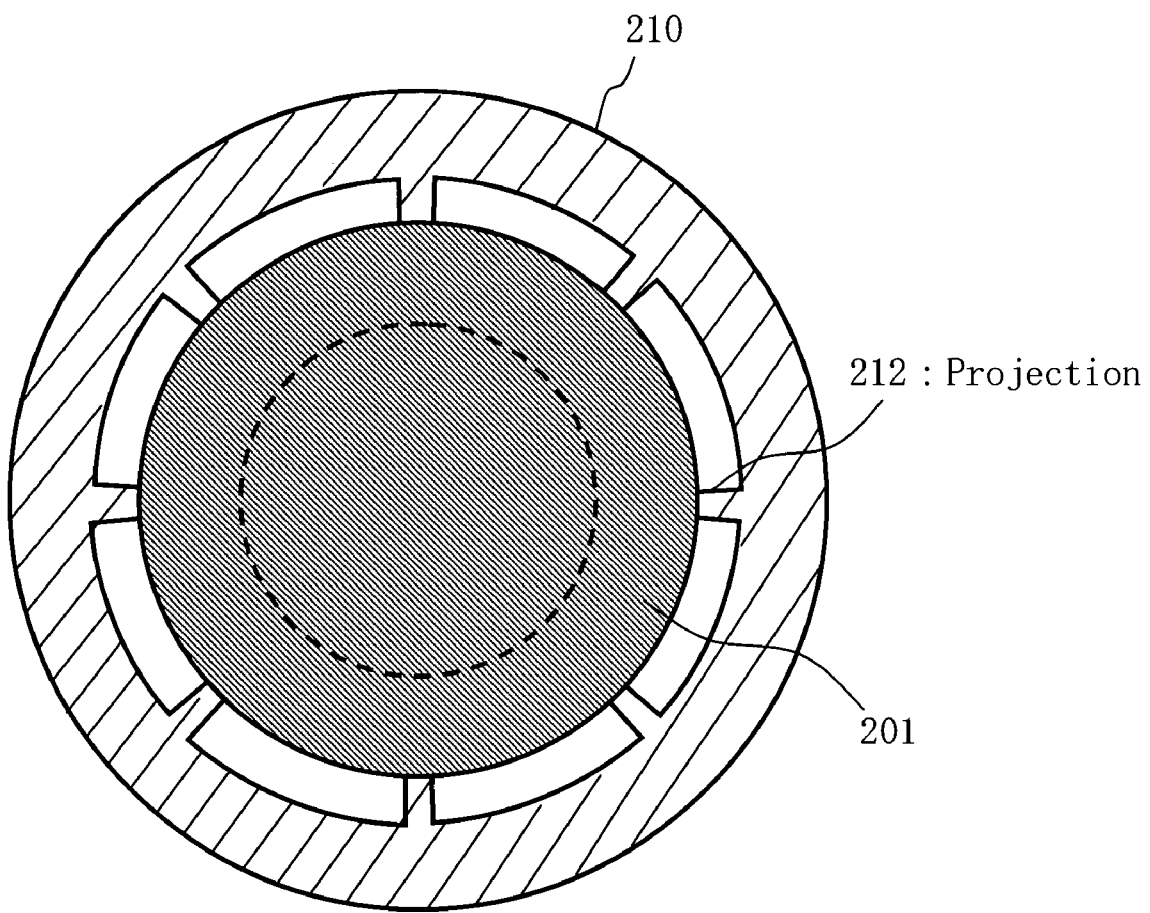
FIG. 12 is a top plan view of a wafer holder supporting thereon a silicon wafer in the apparatus of FIG. 11.
Figure 13:
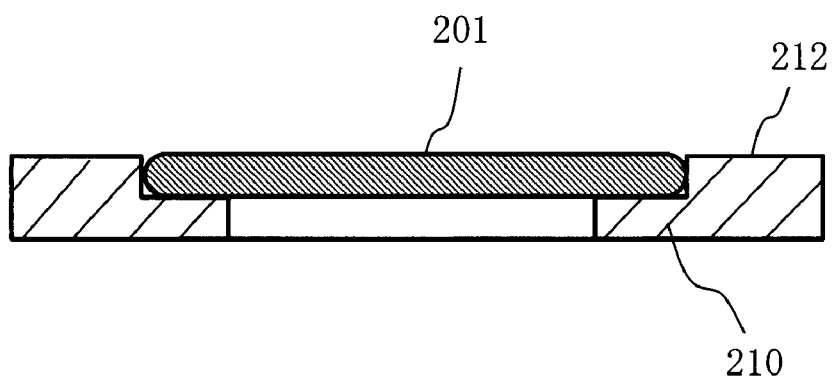
FIG. 13 is a sectional view of the holder and wafer shown in FIG. 12.

A top plan view of the wafer holder 210 with silicon wafer 201 mounted thereon is shown in FIG. 12. Its sectional view is depicted in FIG. 13. As shown herein, the first projections 212 that are formed on the wafer-supporting annular surface of the holder 210 extend inward along radial directions from the recess's (or "depressed portion's") inner sidewall toward the center of holder 210. Each projection has a tip end with a flat face. Here, eight projections 212 are regularly disposed at equal intervals along the annular bottom face of the recess of holder 210. Upon rotation of holder 210, the silicon wafer 201 can move or offset in the parallel direction with the wafer surface due to application of the centrifugal force thereof. Even in this case, the result is merely that part of the sideface of wafer 201 is brought into contact with one or some of eight projections 212. Owing to this wafer offset suppressibility, it is possible to lessen the contact area when compared to the case where a holder that does not have the projections 212 is used to support the wafer 201 which can come into contact with a wide-area of inner sideface of such holder.

Accordingly, even when a silicon epitaxial film as grown on sideface part of the silicon wafer 201 comes into contact with a film that was deposited at the tip ends of projections 212, the contact area thereof is small. This makes it possible to reduce unwanted adhesion of Si wafer 201 to holder 210. Although in this example the eight (8) equal-spaced projections 212 are used, this number is not to be construed as limiting the invention—any number of projections is employable as far as it is more than or equal to three (3). Generally, the more the projections 212, the greater the centering accuracy of Si wafer 201. Adversely, using a less number of projections 212 makes it possible to lessen the contact area between the Si epi-film as grown on sideface part of wafer 201 and the film that was deposited at the tip end(s) of projection(s) 212.

Desirably, the projections 212 that extend toward the center of silicon wafer 201 are formed so that the length of each is more then the twice the thickness of an epitaxial film to be formed on the surface of Si wafer 201. In this case, a film growing from the sideface of Si wafer 201 becomes substantially the same in thickness as a film grown to the wafer side at those portions other than the projections 212. This length setup feature makes it possible to avoid unwanted contact of the film growing from the sideface of Si wafer 201 and the film as grown to the wafer side at those portions other than the projections 212.

Figure 14:
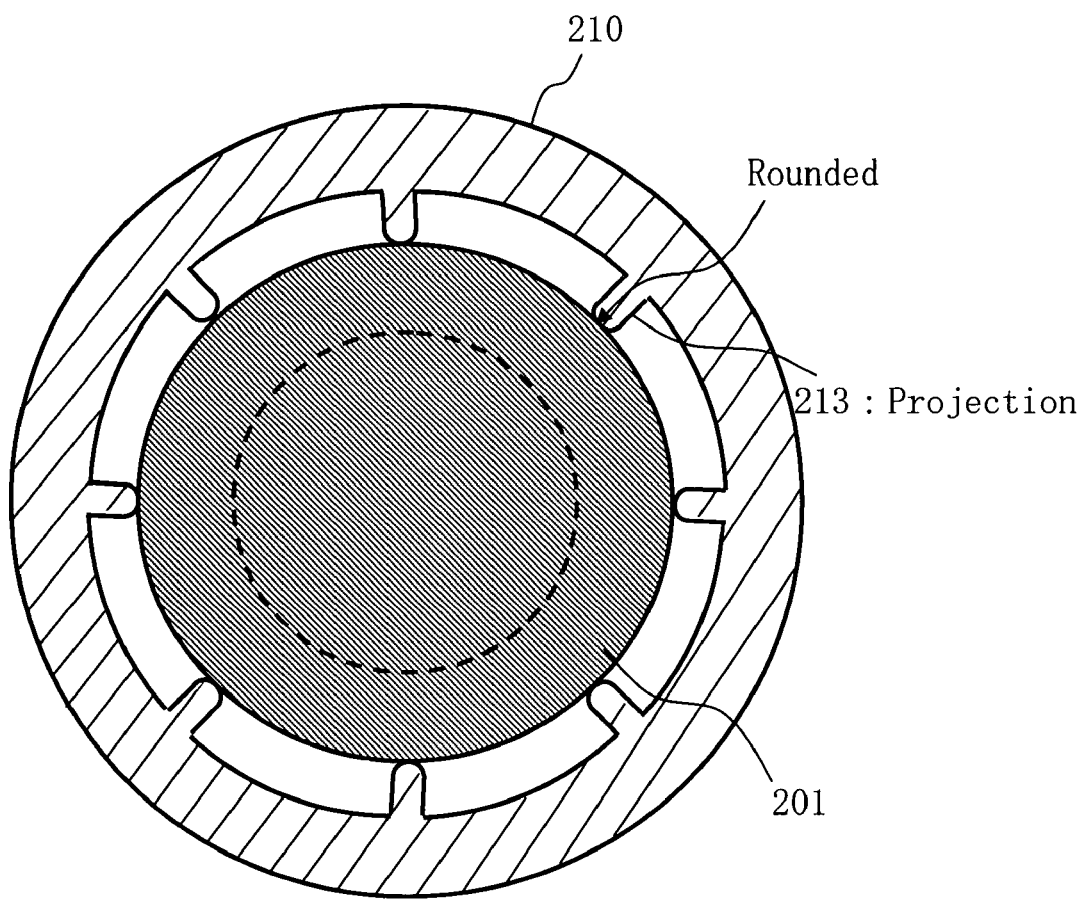
FIG. 14 is a top plan view of another exemplary wafer holder with a silicon wafer mounted thereon.
Figure 15:
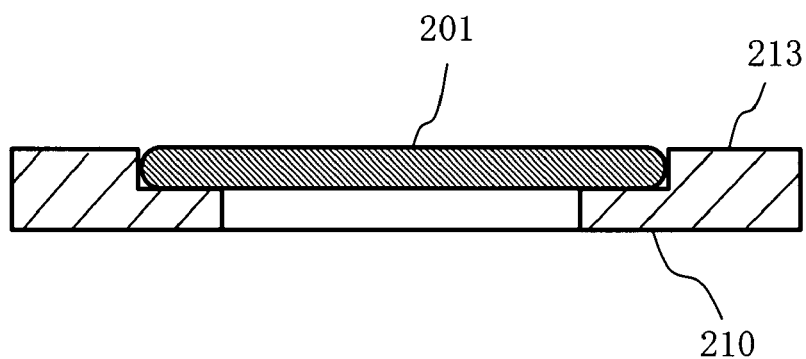
FIG. 15 is a sectional view of the wafer-supporting holder of FIG. 14.

Another example of the wafer holder 210 is shown in FIGS. 14 and 15, wherein the former shows a top plan view of the holder whereas the latter is a sectional view of it. As shown herein, this holder 210 has an annular array of projections 213 which are disposed around a silicon wafer 201 for constraining movement of the silicon wafer 201 in the parallel direction to the surface of this wafer. These projections 213 laterally extend, along radial directions on a plane, toward the center of holder 210 from its inner cylindrical sideface as coupled to its mid-level annular surface that is to be in contact with the backface of Si wafer 201. Each projection 213 has a curved or rounded tip end face, which resembles part of the surface of a circular column. Here, eight projections 213 are laid out at equal intervals. Even when the Si wafer 201 moves in the parallel direction to the wafer surface due to application of the centrifugal force upon rotation of the holder 210, only part of the sideface of Si wafer 201 comes into contact with one or some of these projections 213. Thus it is possible to lessen the contact area when compared to the case where the wafer is contacted with a wide area of sideface of a holder having none of the projections 213.

Further, it is possible to ensure establishment of line contact or point contact even when making contact with the sideface of silicon wafer 201 because of the fact that the projections 213 are designed to have column-like rounded tip end faces. This in turn makes it possible to further lessen the contact area in an event that a silicon epitaxial film as grown at sideface part of the silicon wafer 201 is brought into contact with a film as deposited is at more than one rounded tip end of the projections 213. Thus it is possible to further reduce the adhesion of Si wafer 201 to the holder 210. As in the projections 212 shown in FIG. 12, the specific number, 8, of projections 213 may be changed to any other number as far as it is three or more on a case-by-case basis.

Figure 16:
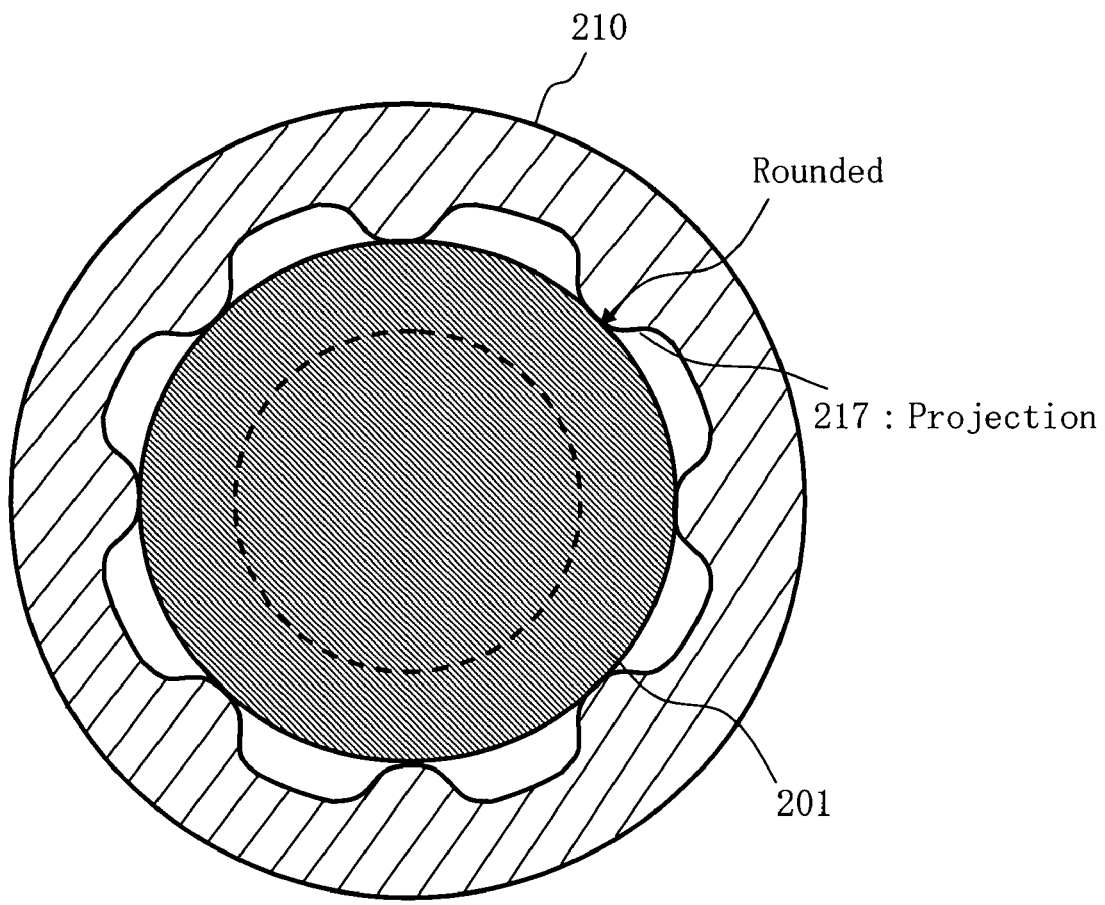
FIG. 16 is a plan view of still another exemplary wafer holder with a silicon wafer held thereon.
Figure 17:
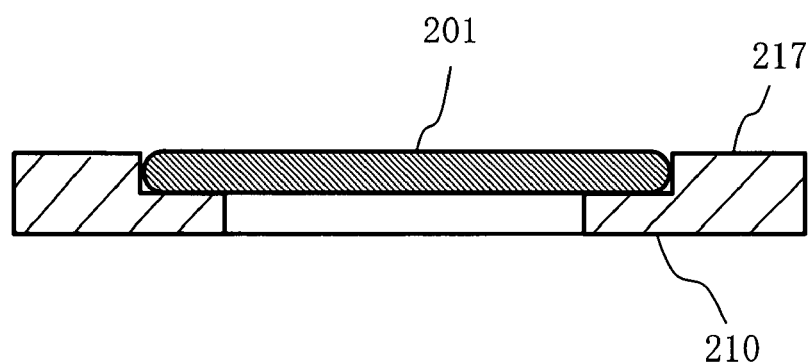
FIG. 17 is a sectional view of the wafer-supporting holder of FIG. 16.

Another example of the wafer holder 210 is shown in FIGS. 16 and 17, wherein the former shows a top plan view of the holder whereas the latter is a sectional view thereof. This holder 210 is similar to that shown in FIGS. 14-15 with the projections 213 being replaced by a lateral continuous corrugated or "waved" pattern of projections 217 along the cylindrical inner sidewall of the circular recess, or "depressed portion" formed in holder 210. These wave-like projections 217 extend inward, along radial directions on a plane, toward the center of holder 120 from the inner recess sidewall that is coupled to the mid-level annular surface being in contact with the backface of Si wafer 201. Each projection 217 has a rounded tip end face, which resembles part of a circular column. Adjacent ones of projections 217 are laterally coupled together by a smoothly curved sidewall to thereby define a planar recess shape like a flower as a while as shown in FIG. 16. With this arrangement also, similar results to those stated above are obtainable.

Figure 18:
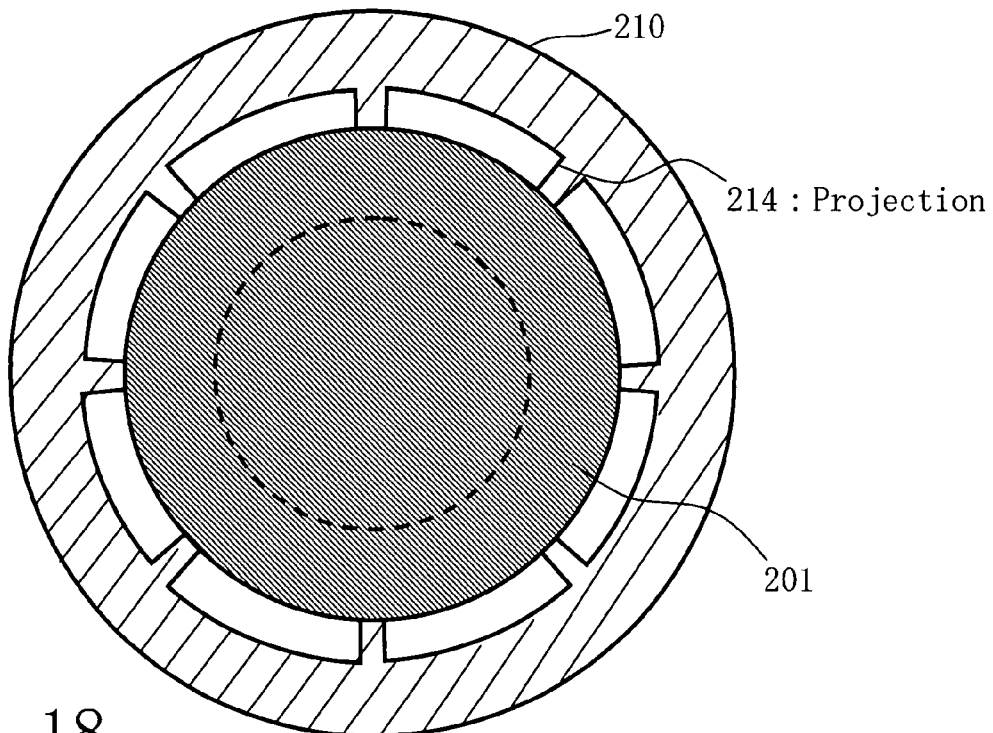
FIG. 18 is a plan view of yet another exemplary wafer holder with a silicon wafer placed thereon.
Figure 19:
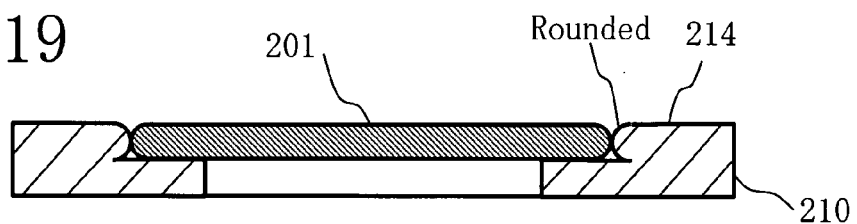
FIG. 19 is a sectional view of the wafer holder of FIG. 18.

Another exemplary wafer holder 210 is shown in FIGS. 18 and 19, wherein FIG. 18 shows a top view of the holder whereas FIG. 19 is its sectional view. This holder 210 has more than three—here, eight—linear projections 214 which are annularly disposed at equal intervals and extend inward along radial directions toward the center of holder 210 from the recess's (or "depressed portion's") inner sidewall that is coupled to its interlevel surface being in contact with the backface of Si wafer 201. Each projection 214 has its endface which is vertically rounded to have a semicircular cross-section as shown in FIG. 19. When rotating the holder 210, even if Si wafer 201 moves in the parallel direction to the wafer surface due to application of the centrifugal force thereof, only part of the sideface of Si wafer 201 comes into contact with one or some of the projections 214. Thus it is possible to lessen the contact area when compared to the case where the wafer is contacted with a wide area of inner sideface of a holder having none of the projections 214.

Further, it is possible to achieve line contact or point contact even when coming into contact with the sideface of Si wafer 201 because of the fact that the projections 214 are designed to have vertically rounded tip end faces. This makes it possible to further lessen the contact area in an event that a silicon epitaxial film as grown at sideface part of the silicon wafer 201 is brought into contact with a film as deposited at more than one rounded tip end of the projections 213. Thus it is possible to further reduce adhesion of Si wafer 201 to the holder 210. Although in this embodiment eight projections 214 are used, this number may be changed to any other number of three or more, as in the projections 212 shown in FIG. 12.

Figure 20:
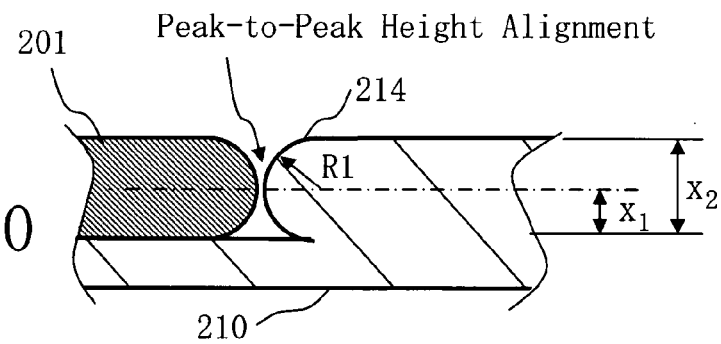
FIG. 20 is an enlarged sectional view of part of the wafer holder which has a recess formed therein and its corresponding peripheral portion of the silicon wafer.

See FIG. 20, which shows an enlarged partial sectional view of one outer circumferential edge of the silicon wafer 201 and its associated one of the projections 214 of the holder 210. As shown herein, the projection 214 is arranged to have a thickness that causes the peak point of its rounded endface to be the same in height as an apex of rounded outer edge face of wafer 201. Typically, the projection 214 is designed to have its peak point height X1 that is one-half of a total height X2 thereof. As an example, for a silicon wafer with its diameter of 200 mm and thickness t of 0.725 mm, the value X1 is set to 0.3625 mm, or more or less.

Preferably, the total height X2 of projection 214 is substantially equal to or slightly larger than the thickness of silicon wafer 201. For example, in the case of a 200-mm diameter silicon wafer with its thickness t of 0.725 mm, the value X2 is set to fall within a range of from 0.725 to 1.5 mm. Also preferably, the vertically rounded tip endface of projection 214 has a sectional radius R1 which is equal to or little larger than the one-half of the thickness t of Si wafer 201. For example, when the 200-mm wafer is 0.725 mm thick, the value R1 ranges from 0.3625 to 0.75 mm.

Figure 21:
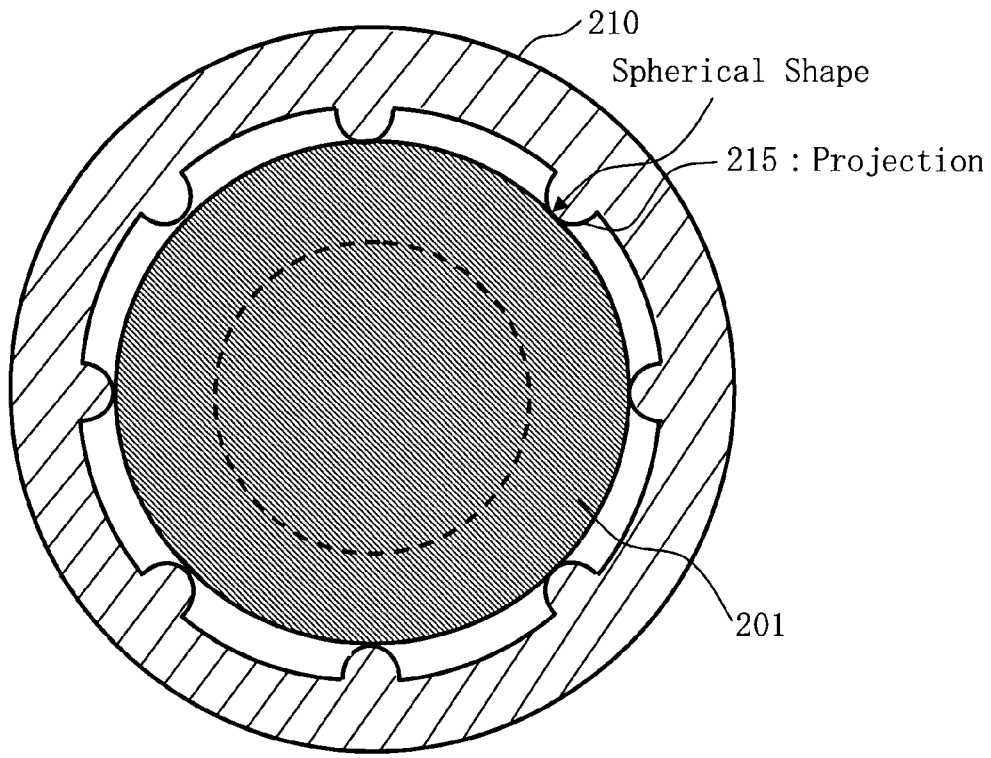
FIG. 21 is a plan view of a further exemplary wafer holder with a silicon wafer held thereon.
Figure 22:
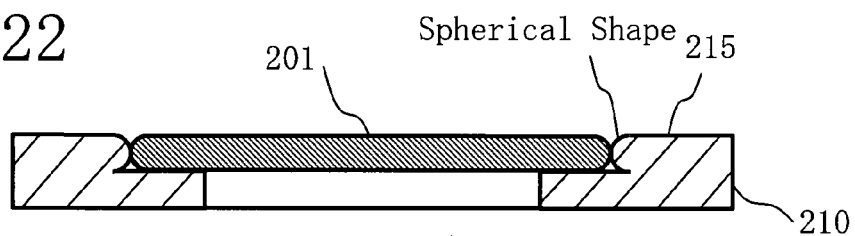
FIG. 22 is a sectional view of the wafer holder of FIG. 21.

Another exemplary wafer holder 210 is shown in FIGS. 21 and 22, wherein FIG. 21 shows a top plan view of the holder whereas FIG. 22 is a sectional view thereof. As shown herein, this holder 210 has an annular array of more than three (e.g., eight) projections 215 extending from the holder's (or "depressed portion's") inner sideface being integral with its mid-level surface for contact with the backface of Si wafer 201 toward the center of holder 210. Each projection 215 has a spherical tip end surface. Here, the eight projections 215 are laid out at equal intervals. Even when the silicon wafer 201 moves in the parallel direction to the wafer surface due to application of the centrifugal force upon rotation of the holder 210, only part of the sideface of Si wafer 201 comes into contact with one or some of these spherical end faces of projections 215. Thus it is possible to lessen the contact area when compared to the case where the wafer comes into contact with a wide area of sideface of a holder having none of the spherical ended projections 215. Further, the spherical endface feature of these projections 215 makes sure that the contact between the wafer sideface and the projection tip end is point contact. This point contact feature makes it possible to further lessen the contact area of a silicon epitaxial film as grown at the sideface of Si wafer 201 and a film as deposited at a spherical tip end(s) of the projections 215. Thus it is possible to minimize unwanted adhesion of wafer 201 to holder 210. Although eight equal-spaced projections 215 are laid out herein, this number may be changed to any other number of three or more on a case-by-case basis, as in the previous embodiments.

Figure 23:
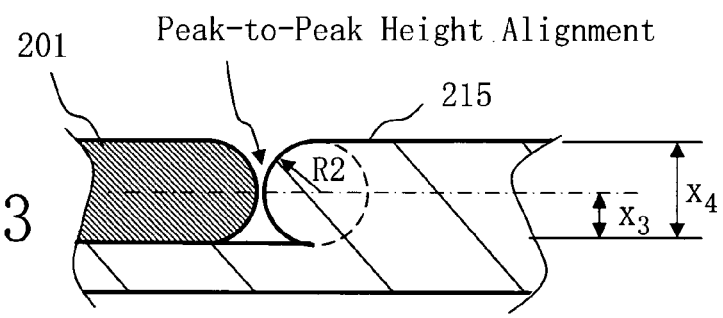
FIG. 23 is an enlarged sectional view of part of the holder with a recess formed therein and its corresponding portion of the wafer.

An enlarged partial sectional view of one outer peripheral edge of the silicon wafer 201 and its associated one of the projections 215 of the holder 210 is shown in FIG. 23. As shown herein, the projection 215 is arranged to have a side peak point which is the same in height as its corresponding opposed peak of rounded sideface of Si wafer 201 to ensure achievement of point contact therebetween. More specifically, the side peak height X3 of projection 215 is equal to one-half (½) of the thickness of Si wafer 201. An example is that in case the wafer is 200 mm in diameter and 0.725 mm in thickness t, the size X3 is set to 0.3625 mm or nearly equal thereto.

Preferably, the height X4 of projection 215 is substantially equal to or slightly larger than the thickness of Si wafer 201. For example, for the 200-mm wafer with its thickness t of 0.725 mm, X4 is determined to range from 0.725 to 1.5 mm.

Also preferably, projection 215 is designed so that its spherical tip-end surface has a radius R2 which is equal to or little larger than one-half of the thickness of Si wafer 201. For example, in the case of the 200-mm wafer with its thickness of 0.725 mm, the value R2 is determined so that it falls within a range of from 0.3625 to 0.75 mm in a similar way to the example shown in FIG. 20.

Figure 24:
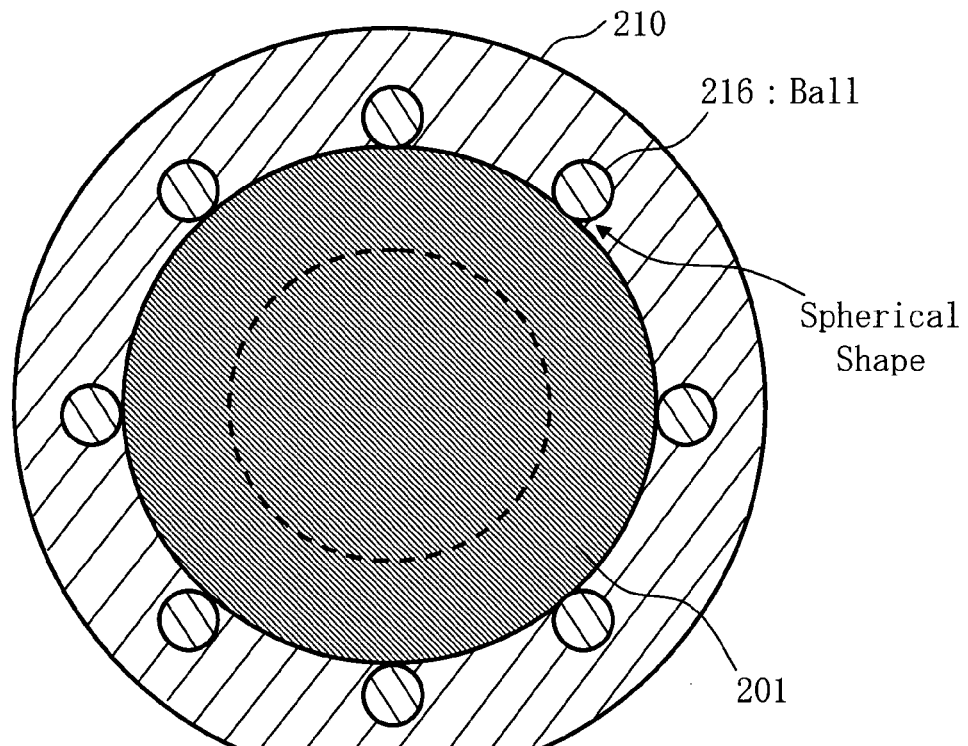
FIG. 24 is a plan view of another further exemplary wafer holder having an annular array of wafer-positioning balls and a silicon wafer mounted thereon.
Figure 25:
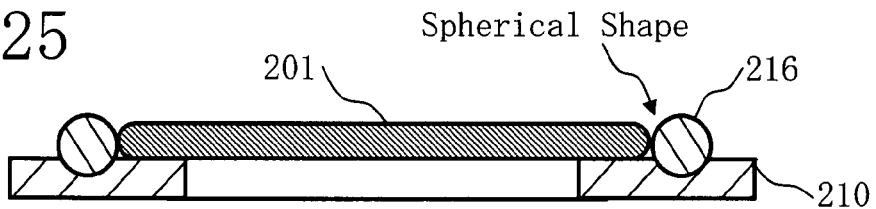
FIG. 25 is a sectional view of the holder of FIG. 24.

Another exemplary wafer holder 210 supporting a silicon wafer 201 is shown in FIGS. 24 and 25, wherein FIG. 24 shows a top plan view of the holder and FIG. 25 is its sectional view. This holder 210 is a ring-like flat plate which has, on its top surface for contact with the backface of Si wafer 201 mounted, more than three—e.g., eight—balls 216 are circularly disposed at equal intervals along the circumferential length of holder 210. These balls 216 include a pair of farthest balls with the holder center being midway therebetween, which balls have their opposed peak points that are at a distance corresponding to the diameter of Si wafer 201. This ball layout permits the wafer 201 to be encircled by these balls 216 at its outer periphery. Each ball 216 is situated in a corresponding one of dimples in the top surface of holder 210 and is rigidly adhered by welding thereto. Even when Si wafer 201 moves in the parallel direction to the wafer surface due to application of the centrifugal force upon rotation of the holder 210, only part of the sideface of Si wafer 201 comes into contact with one or some of these balls 216. Thus it is possible to lessen the contact area when compared to the case where the wafer is contacted with a wide area of sideface of a holder having none of the balls 216.

Use of the wafer-positioning balls 216 makes sure that the wafer's sideface and its opposing spherical sideface of ball 216 are in point contact with each other. This point contact feature makes it possible to further lessen the contact area of a silicon epitaxial film as grown at the sideface of Si wafer 201 and a film grown on the spherical sideface of ball 216. Thus it is possible to minimize or avoid unwanted adhesion of wafer 201 to holder 210. Note that the number, 8, of the equal-spaced balls 216 provided herein may be changed to any number as far as it is three or more, as in the previous embodiments.

Figure 26:
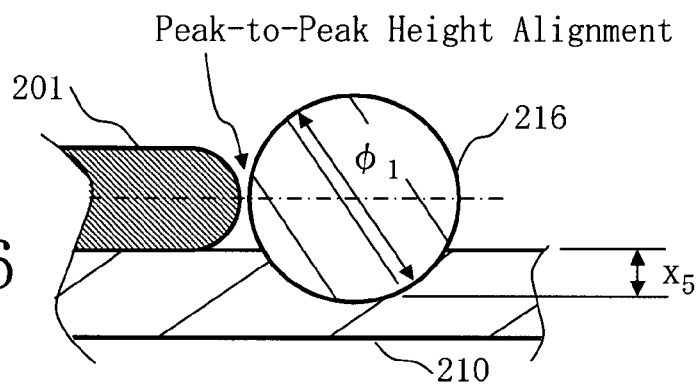
FIG. 26 is an enlarged sectional view of part of the holder which has a ball and its corresponding peripheral portion of the wafer.

An enlarged partial sectional view of one outer peripheral edge of the silicon wafer 201 and one of the wafer-positioning balls 216 of the holder 210 is shown in FIG. 26. The ball 216 welded is arranged to have a side peak point which is the same in height as its corresponding opposed peak of rounded side edge of Si wafer 201 to ensure that establishment of point contact therebetween. More specifically, each ball 216 is designed so that its diameter $\phi 1$ is slightly larger than the thickness of Si wafer 201 by a degree corresponding to its buried depth X5—that is, the depth of a ball-receiving dimple in the top surface of holder 210. An example is that in case the 200-mm diameter wafer has its thickness t of 0.725 mm, the size $\phi 1$ is set to 1 to 1.5 mm when the dimple depth X5 is determined to range from 0.1375 to 0.6375 mm in order to make sure that ball 216 is stably placed therein.

Figure 27:
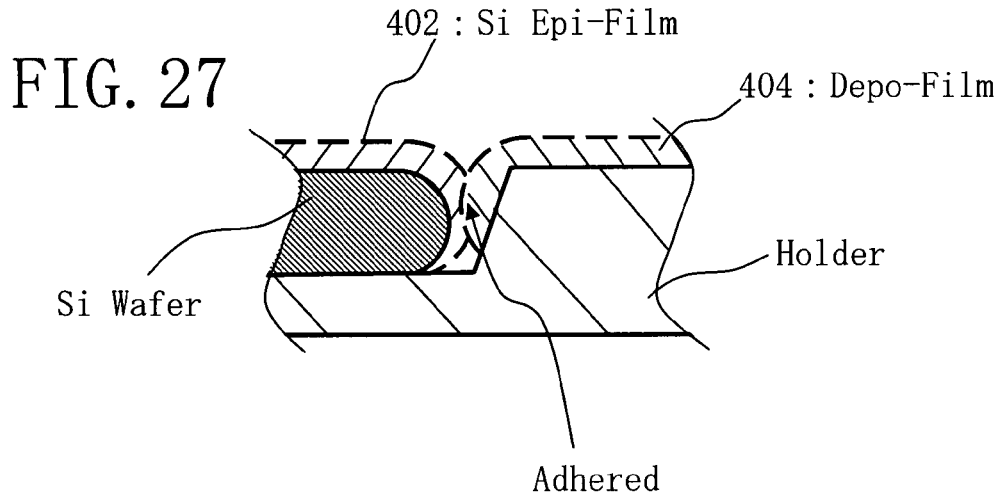
FIG. 27 shows a partial sectional view of a wafer holder of the type having no projections and peripheral part of a silicon wafer as held on the holder in the state that an epitaxial film is formed thereon.

An exemplary state of a film which was formed using a wafer holder that does have none of the above-stated wafer-positioning projections 212-217 but have a mere sloped recess sidewall is shown in FIG. 27 in cross-section, while a film that was formed using the wafer holder 210 having the projections embodying this invention is shown in FIG. 28. As shown in FIG. 27, in the case of the holder without the projections, a silicon epitaxial film 402 that was grown at sideface part of the silicon wafer comes into contact with a depo-film 404 as deposited on the slant recess sideface of the holder. In the worst case, these films are adhered or "bonded" together, resulting in adhesion of Si wafer to the holder.

Figure 28A:
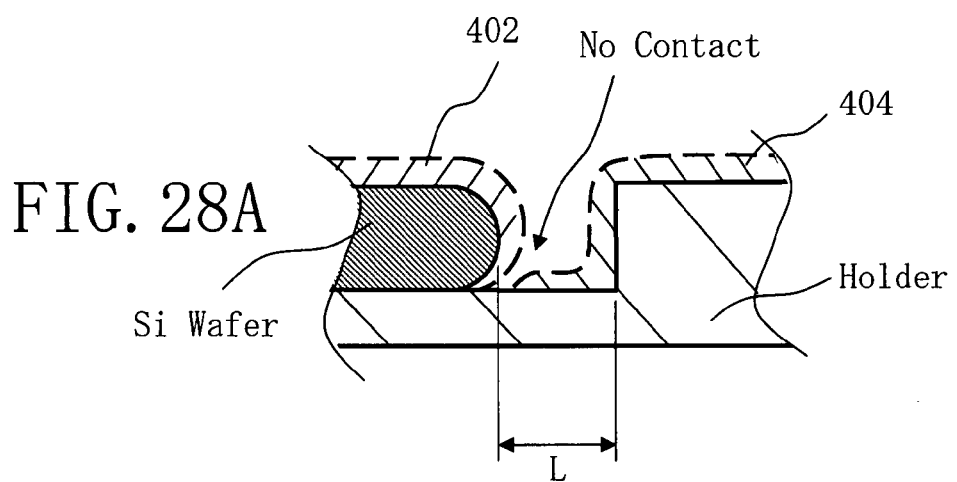
FIG. 28A is a partial sectional view of a wafer holder with projections for use in the VPE apparatus and peripheral part of a silicon wafer in the state that an epitaxial film is formed thereon.
Figure 28B:
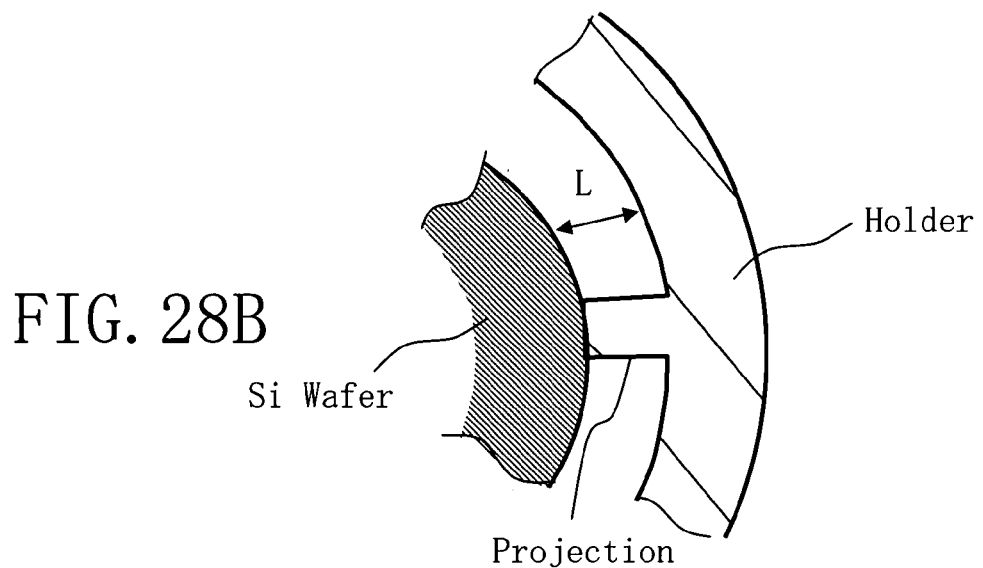
FIG. 28B is a corresponding partial plan view thereof.

In contrast, as shown in FIG. 28A, in the case of the holder with the wafer-positioning projections as in any one the embodiments stated supra, it is possible to prevent a silicon epitaxial film 402 as grown at the sideface part of Si wafer from coming into contact, at those positions other than the projections, with a depo-film 404 as deposited on the bottom face and sideface of the holder. Here, as shown in FIG. 28B, it is desirable that the length L of a projection laterally extending toward the center of Si wafer is greater than twice the thickness of a film to be formed using a raw gas on the wafer surface. Typically, at positions other than the projections, the film to be grown from the sideface of Si wafer is substantially the same in thickness as the film being grown to the Si wafer side at the portions other than the projections.

Thus it is possible to avoid unwanted contact between the silicon epitaxial film 402 to be grown from the sideface of Si wafer and the depo-film 404 as grown to the wafer side. For example, in case the Si epi-film is formed to a thickness of 120 μm, the size L is set at 240 μm (0.24 mm) or more.

Figure 29:
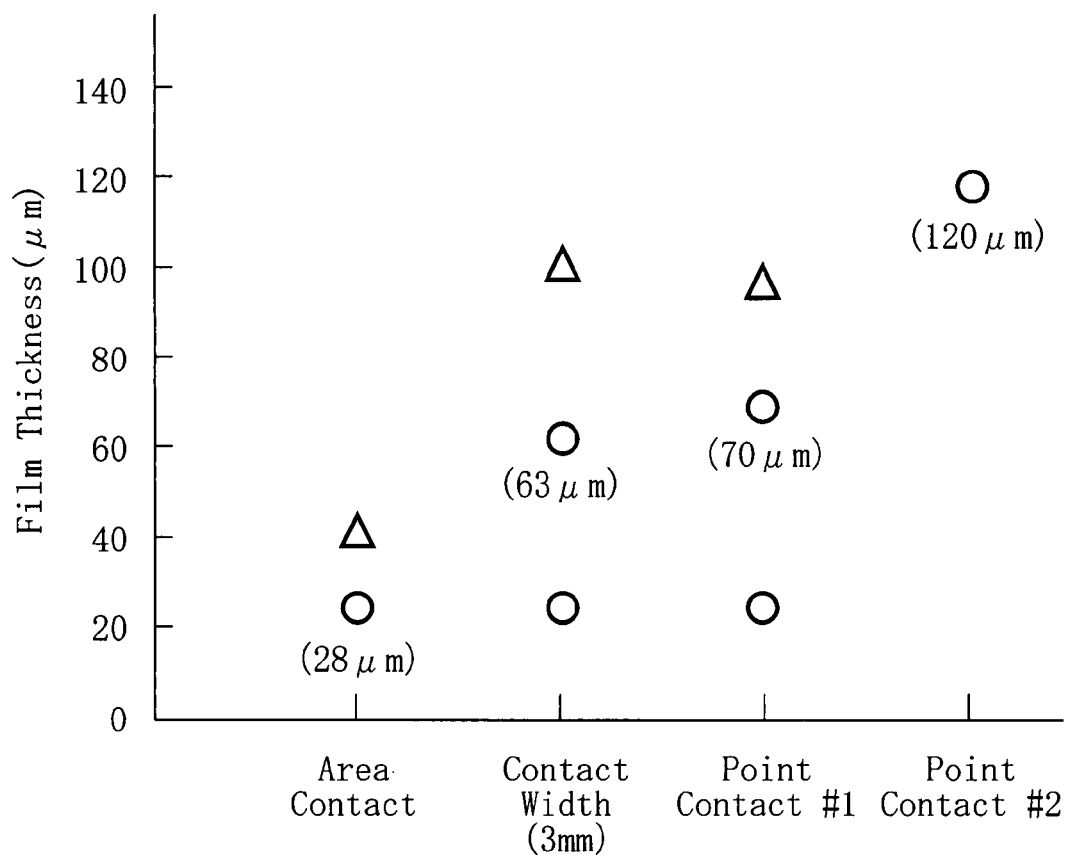
FIG. 29 is a diagram graphically showing plots of epitaxial film thickness with respect to several film-to-holder contact phenomena.

See FIG. 29, which is a graph showing some exemplary plots of silicon epitaxial film thickness versus film-to-holder adhesivity. In the measurement of these thickness values, the silicon source for use as a comparison object is a gas of trichlorosilane ($SiHCl_3$) diluted by hydrogen ($H_2$) to 25%, which was supplied from the shower head 130 at a feed rate of 34 Pa·m³/sec (i.e., 20SLM). A carrier gas of $H_2$ was also fed from showerhead 130 at a rate of 85 Pa·m³/sec (i.e., 50SLM). The concentration of $SiHCl_3$ in an entirety of the gas was set at 7.2%. The inner heater 160 was set to 1100° C. while the outer heater 150 was at 1098° C. The rotation speed of Si wafer was set to 500 rpm ($min^{-1}$). The internal pressure of growth reactor chamber was set at $9.3 \times 10^4$ Pa (700 Torr).

As shown in FIG. 29, in the case of using a holder with none of the wafer-positioning projections 212-217 in the embodiment (i.e., with a mere recess), when a silicon epitaxial film was formed to a thickness of 28 μm, the Si wafer did not adhere to the holder. However, when the Si epi-film was formed to a thickness of 40 μm, slight adhesion was occurred between the wafer and the holder. In contrast, in case the flat end projections (its width of contact with Si wafer is 3 mm) of the embodiment are provided, even when a Si epi-film was formed to a thickness of 63 μm, the wafer did not adhere to the holder. However, when the Si epi-film was formed to a thickness of 100 μm, slight adhesion was occurred between the wafer and holder. Further, in case the rounded or sphered end projections (point-to-point contact with Si wafer; i.e., point contact No. 1) are provided as in another embodiment, when a Si epi-film was formed to a thickness of 70 μm, the wafer did not adhere to the holder. However, when the Si epi-film was formed to a thickness of 90 μm, slight adhesion was occurred between this wafer and the holder.

As apparent from the foregoing, by using any one of the annular arrays of projections 212-217 in the embodiments, it is possible to increase the allowable film thickness when compared to the case where such projections are not provided. In addition, letting the projections offer point contact capability rather than area contact, it is possible to further increase the allowable film thickness.

The allowable film thickness is further increasable by changing the process conditions—typically, by reducing the concentration of the $SiHCl_3$ silicon source and increasing the temperature of Si wafer. An example is that the feed rate of $H_2$ gas was increased by 85 Pa·m$^3$/s (50SLM), resulting in the density of $SiHCl_3$ in an entirety of the raw gas being dropped down from 7.2% to 4.2%. Additionally the temperature of inner heater 120 was increased to 1200° C., and the temperature of outer heater 150 was raised up to 1126° C. With the process parameter settings, when providing the tip-rounded or sphered projections (point contact No. 2), the Si wafer did not adhere to the holder. Even when Si epi-film was formed to a thickness of 120 μm, the wafer did not adhere to the holder.

Embodiment 4

While in Embodiment 3 the wafer-positioning projections 212-217 are provided to lessen the contact area between a film as grown at sideface part of the wafer and a film deposited on the holder side, an explanation will be given in Embodiment 4 as to the shape of a holder with smaller contact area than that in the prior art, although its effect is worse than the previous embodiments.

Figure 30:
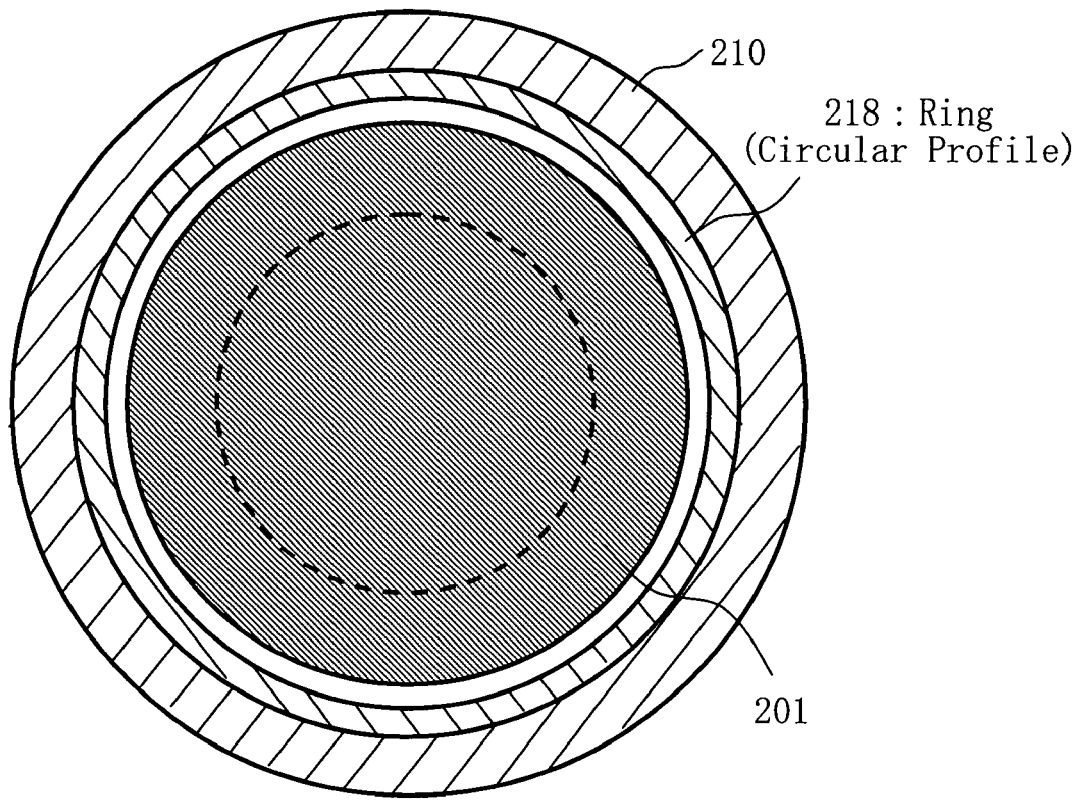
FIG. 30 is a plan view of a wafer holder for supporting thereon a silicon wafer in accordance with a further embodiment of the invention.
Figure 31:
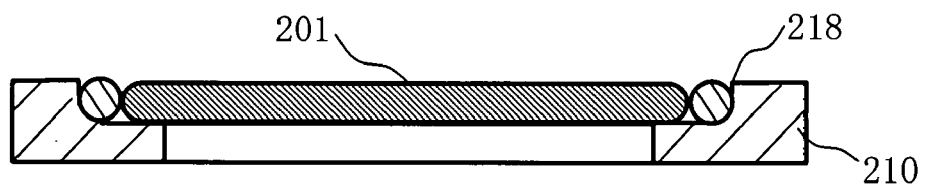
FIG. 31 is a cross-sectional view of the wafer holder of FIG. 30.

A wafer holder 210 supporting thereon a silicon substrate or wafer 201 having a round beveled edge in accordance with this embodiment is shown in FIGS. 30 and 31, wherein FIG. 30 shows a top plan view of the holder whereas FIG. 31 is a cross-sectional view thereof. As shown herein, this holder 210 is a round disc-like flat plate en masse, which has a central opening and an annular top surface with a circular recess or "depressed portion" defined therein. This recess is larger in diameter than Si wafer 201 and has a rounded bottom corner at which a wafer-positioning ring 218 is stably situated. This ring 218 is circular in cross-section as better shown in FIG. 31. Its spherical inner sideface is in lateral contact with the rounded outer periphery of Si wafer 201 that is mounted on holder 210 to thereby constrain unwanted movement and offset of wafer 201 in the parallel direction to the surface of holder 210. The ring 218 may be welded to holder 210. In the holder structure having the wafer-positioning ring 218, the inside ring surface opposing the rounded outer peripheral edge of Si wafer 201 is sphered or rounded in its cross-section. Accordingly, even when the Si wafer 201 moves and offset in the parallel direction to the wafer surface due to the application of the centrifugal force upon rotation of the holder 210, only part of the sideface of Si wafer 201 comes into line-contact with the rink 218. Thus it is possible to lessen the contact area when compared to the case where the wafer is contacted with a wide area of sideface of a holder that does not have the ring 218. This results in that the contact area is small when a silicon epitaxial film as grown at the sideface part of Si wafer 201 is brought into contact with a film as deposited at the inner sideface of ring 218. Thus it is possible to suppress unwanted adhesion of wafer 201 to holder 210 when compared to the prior art.

Figure 32:
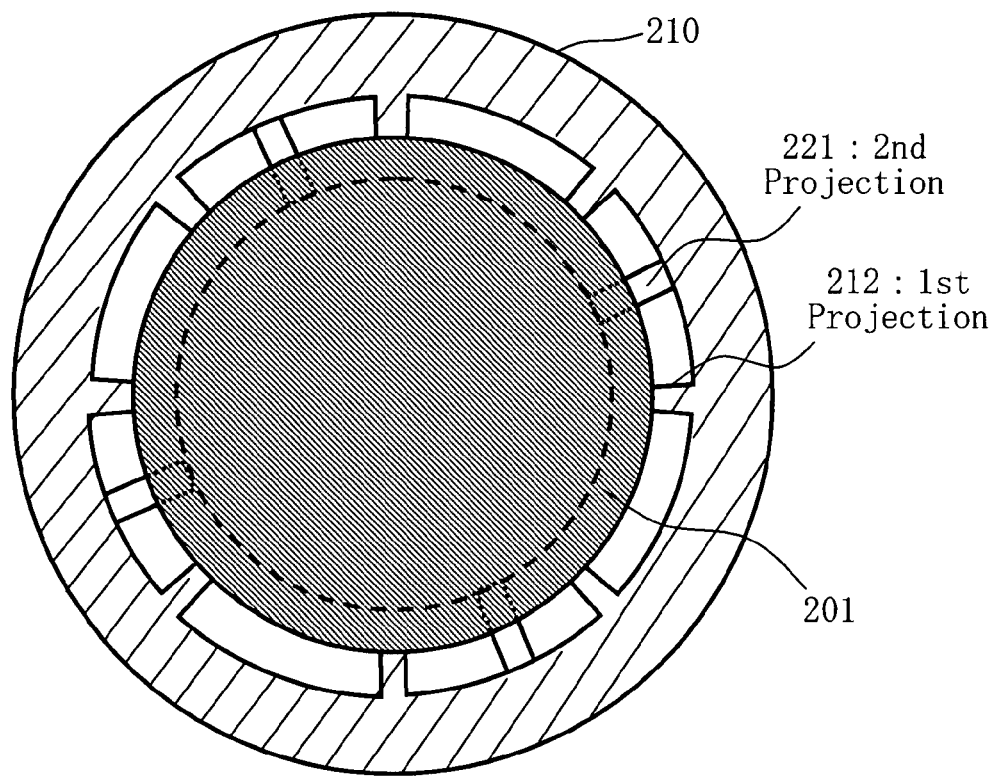
FIG. 32 is a plan view of another exemplary wafer holder for supporting thereon a silicon wafer.

A top plan view of another exemplary wafer holder 210 supporting thereon a silicon wafer 201 is shown in FIG. 32. This holder 210 is similar to that shown in FIG. 12 with the center hole being modified in diameter and with an annular array of further projections 221 being added to the projections 212. Each of the "second" projections 221 is between adjacent ones of the "first" projections 212. The first and second projections 212 and 221 extend inward along radial directions on a plane toward the center of holder 210. First projections 212 have tip end faces or "walls" to be brought into contact with the peripheral sideface of Si wafer 201. Second projections 221 are less in height (or thickness) than first projections 212 and are laterally long enough to make contact with the backface of wafer 210 at their top surface portions. Although in this example four second projections 221 are provided, this number is modifiable to any number as chosen from a range of from three (3) to ten (10)—preferably eight (8), which is the same as the number of first projections 212. This can be said because the use of more than ten projections 221 can result in an increase in contact area with the backface of wafer 201; using less than three ones would result in the lack of wafer support stability for epitaxial growth.

Figure 33:
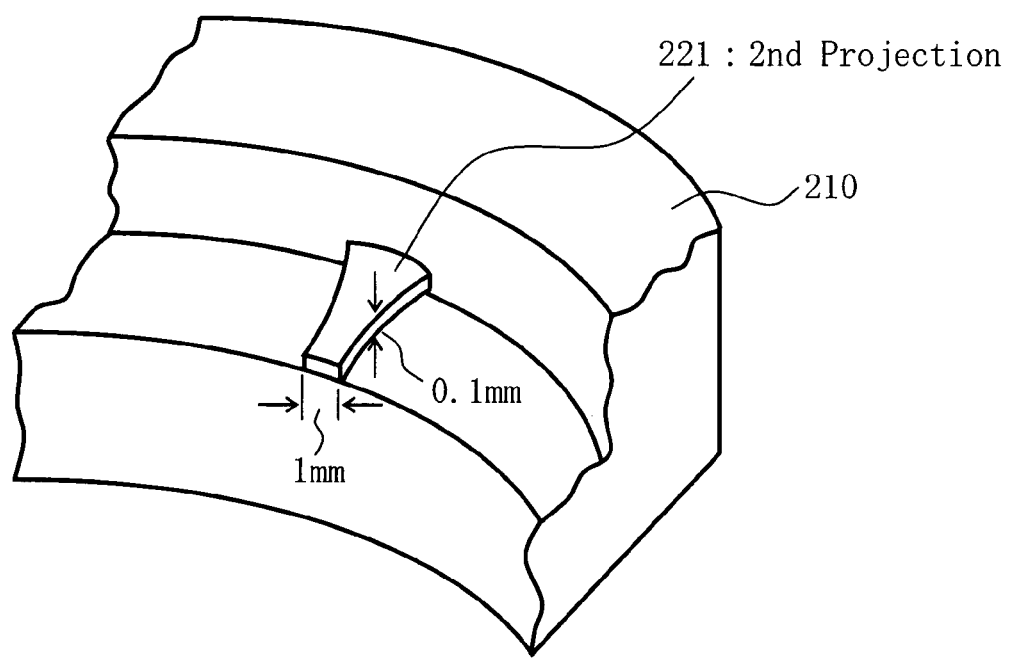
FIG. 33 is an enlarged perspective view of an inside portion of the wafer holder which has an additional projection in its recess.

A perspective view of an inside portion of the wafer holder 210 is shown in FIG. 33, wherein one of the second projections 221 is seen. This projection 221 is designed to have a thickness of from 0.1 to 0.5 mm and a tip end width of 0.5 to 3 mm. Preferably the thickness is 0.1 mm and the width is 1 mm, although these values are modifiable in a way depending on the thickness of a silicon epitaxial film to be grown and the size of Si wafer 201 as well as film-forming apparatus used.

The second projections 221 have flat tip-end surface that is flush with the cylindrical inside wall of the holder center hole as shown in FIG. 33, although these may alternatively be designed so that their end faces are curved, rounded, sphered, fine waved or corrugated. In light of the requirement for achievement of the minimum contact area with the Si wafer 201, use of the spherical endface design is deemed desirable because of its point contactability in most cases.

Using the second projections 221 in combination with first projections 212 makes sure that unwanted adhesion of the wafer backface to the holder hardly occurs. This makes it possible to form an epitaxial growth film with a thickness of about 30 nm, which is large enough to fill on-chip element isolation grooves or trenches of IGBTs, for example. It was also possible to form an epi-film of 50 nm thick or more, which is the thickness of an n-base of IGBT. In addition, this embodiment holder is also applicable to a process for filling in trenches a p-type semiconductor layer with a thickness of 30 nm or greater.

With the wafer holder 210 having the almost alternate annular layout of first and second projections 212 and 221, which planarly extend inward along radial directions toward the center of holder 210 from the inner sidewall of the recess as coupled to the interlevel ring-like surface being in contact with the backface of Si wafer 201, even when the Si wafer 201 moves in the parallel direction to the wafer surface due to the application of a centrifugal force upon rotation of holder 210, only part of the sideface of wafer 201 comes into contact with one or some of the ends of first projections 212. Thus it is possible to lessen the contact area when compared to the case where the wafer comes into contact with a wide area of sideface of a holder having none of the wafer-positioning projections 212. As a result, the contact area is kept small of a silicon epitaxial film as grown at the sideface of Si wafer 201 and a film grown on a tip end(s) of projection(s) 212. Thus it is possible to suppress unwanted adhesion of wafer 201 to holder 210.

Although in this example eight first projections 212 are disposed at equal intervals, this number may be changed to any number as far as it is three or more. Using an increased number of projections 212 makes it possible to improve the accuracy of centering Si wafer 201. Adversely, use of a less number of them makes it possible to lessen the contact area of Si epi-film grown at sideface part of wafer 201 and a film deposited at one or more tip ends of projections 212. In this embodiment, a prespecified number—here, four—of second projections 221 are provided on the holder's step-like interlevel surface to be contacted with the backface of Si wafer 201 in such a way as to have tip end faces that are brought into contact with the outer periphery of Si wafer 201 for positioning and supporting the same.

As stated above, the holder 210 is arranged to have the specified number of wafer-positioning projections 212 which are laid out to encircle Si wafer 201 for restraining unwanted lateral movement of wafer 201 in substantially the same direction as the wafer surface, while at the same time supporting the wafer on the top surfaces of the second projections 221 each being positioned between adjacent ones of the first projections 212. With such the arrangement, it is possible to reduce the risk of adhesion of wafer 201 to holder 210. Further, setting the process conditions in the above-stated way makes it possible to control the film thickness distribution on the surface of a semiconductor layer to be formed while flowing a gas from the inflow path 122 so that it is kept at 0.5% or less.

Figure 34:
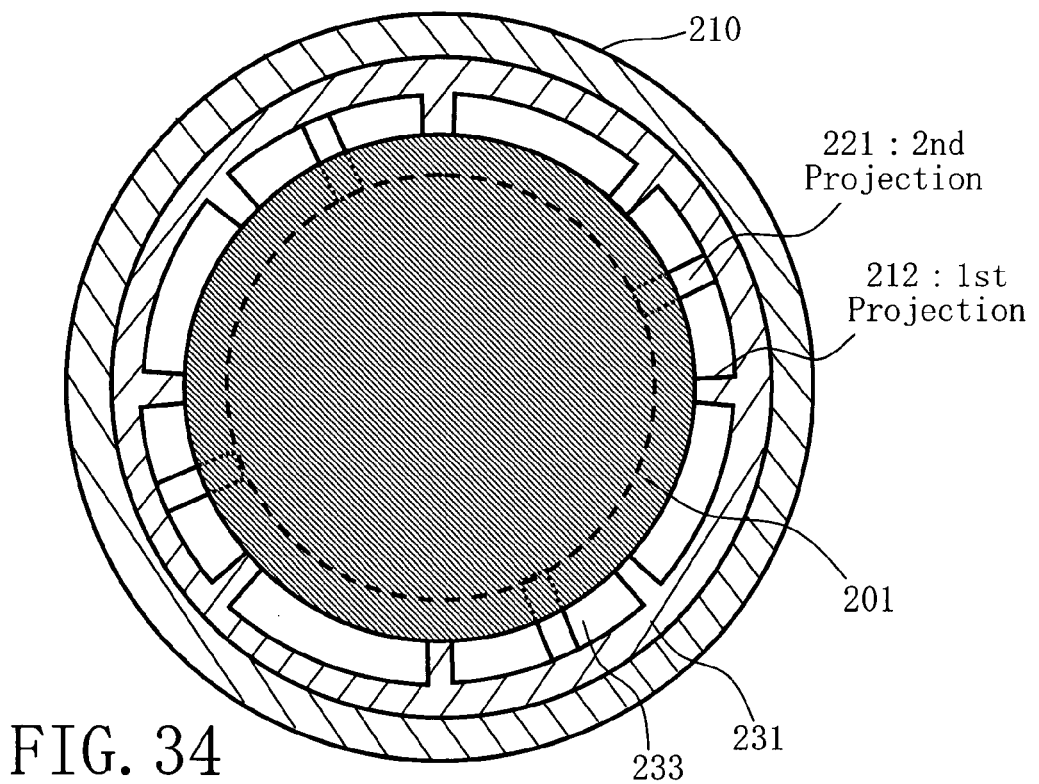
FIG. 34 is a plan view of a further example of the holder structure supporting thereon a silicon wafer.
Figure 35:
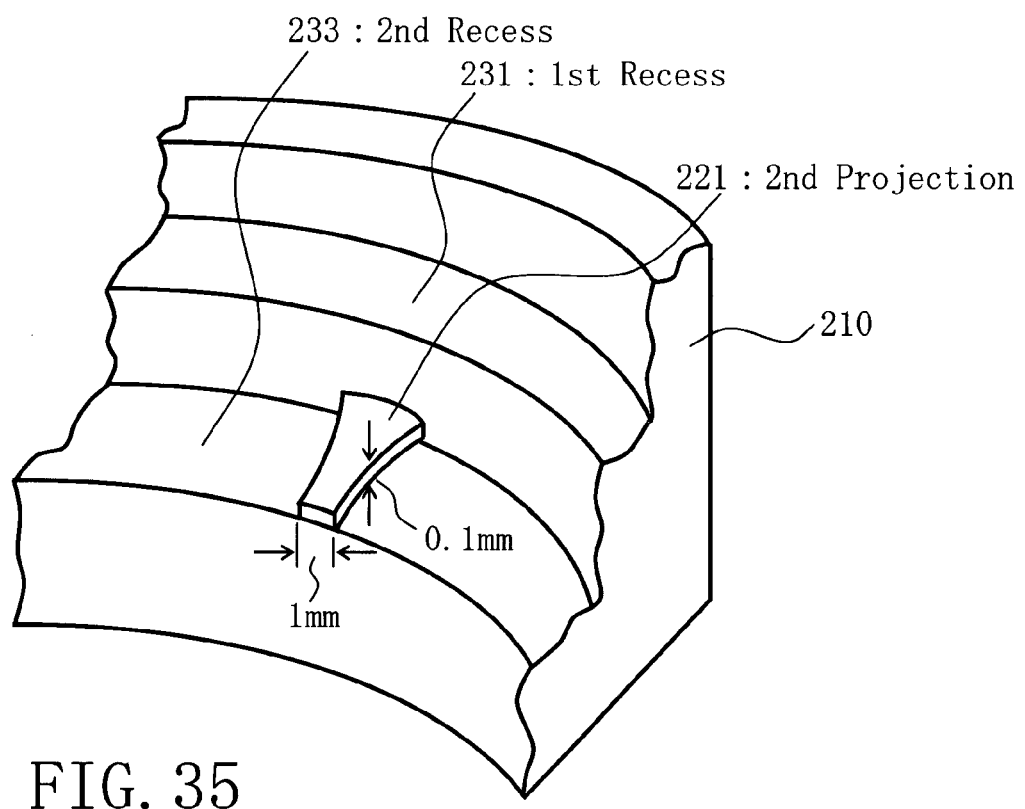
FIG. 35 is an enlarged perspective view of part of the wafer holder which has an additional projection in its low-level recess.

A plan view of another exemplary wafer holder 210 with a silicon wafer 201 supported thereon is shown in FIG. 34. This holder has a two-step recess structure made up of first and second circular recesses 231 and 233. Holder 210 also has an annular layout of first projections 212 and second projections 221 as in the holder of FIG. 32. An enlarged perspective view of part of the holder 210 which includes one of the second projections 221 is shown in FIG. 35. As shown in FIGS. 34-35, the holder 210 is similar to Embodiment 1 in that the second recess 233 is concentrically defined in the bottom of first recess 231. Second recess 233 has its depth less than the thickness of Si wafer 201. This recess 233 has a ring-like bottom surface, on which the first and second projections 212 and 221 are provided. As previously stated in terms of the holder of FIG. 32, these projections 212 and 221 extend inward along radial directions on a plane toward the center of holder 210 from sideface of the second recess 233. The second projections 221 are formed on the bottom face of second recess 233. The first projections 212 are for restraint of lateral movement of Si wafer 201 that is on the holder 210 while being supported at its bottom face on top surface portions of second projections 221. Further, by setting the process conditions in the way stated supra, it is possible to control at 0.5% or less the thickness distribution of a semiconductor film on the surface of Si wafer 201, which film is formed while flowing a gas from the inlet 222 into reactor chamber 220.

With this method, the semiconductor film formed on the wafer is uniform in thickness at its peripheral portions, thereby enabling use of substantially the entire of the wafer. During the film fabrication, if the wafer moves beyond the sidewall of second recess 233, it is possible to prevent it from being accidentally detached from the holder 210. Also importantly, the presence of a groove that is defined by the first recess around the wafer 201 makes it possible to thin a depo-film to be deposited at the bottom of such groove corresponding to the bottom face of first recess.

Preferably the first recess 231 in the holder 210 is arranged to have its depth less than the thickness of Si wafer 201. With such arrangement, it becomes possible to uniformize the flow of a gas from the inlet 222 onto wafer 201.

The use of first and second projections 212 and 221 minimized unwanted adhesion of the backface of Si wafer 201 to holder 210, resulting in epitaxial growth of a semiconductor film to a thickness of about 60 nm or more, which is equivalent to the thickness of n-base.

Note here that the wafer holder structure may be applicable to fabrication of epitaxial films for use in high breakdown voltage power semiconductor circuit elements with a thick base other than the IGBT, including but not limited to power MOS transistors, standard power thyristors (SCRs), gate turn-off (GTO) thyristors to be used as switching elements in electric trains or railcars.

Figure 36:
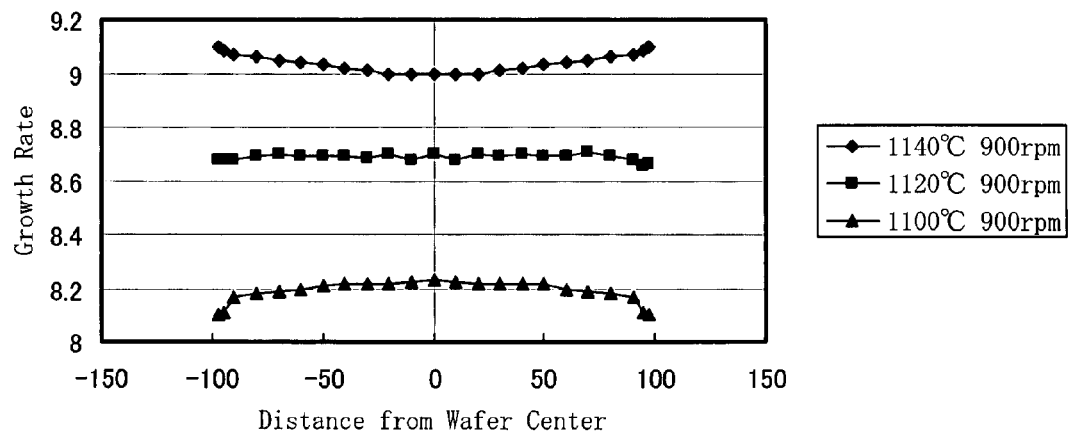
FIG. 36 is a graph showing curves of epitaxial growth rate versus distance from the center of a wafer at varying temperatures with a wafer rotation speed being fixed at a prespecified value.

FIG. 36 is a graph showing curves of epitaxial growth rate versus distance from wafer center, which were measured at a constant wafer rotation speed, e.g., 900 rpm, while varying a wafer temperature. In the process parameters as set up in respective embodiments stated previously, the wafer temperature was set so that it ranges from 1100 to 1140° C. In FIG. 36, the growth rate was measured while letting the wafer temperature change from a minimal value of such range to an intermediate value and then to a maximal value thereof. As can be seen from this graph, when setting at the maximum and minimum values, the growth rate exhibits irregular variations depending upon in-plane positions of Si wafer, although such variations fall within the allowable range. When going beyond this range, the variation of growth rate becomes larger unacceptably.

Figure 37:
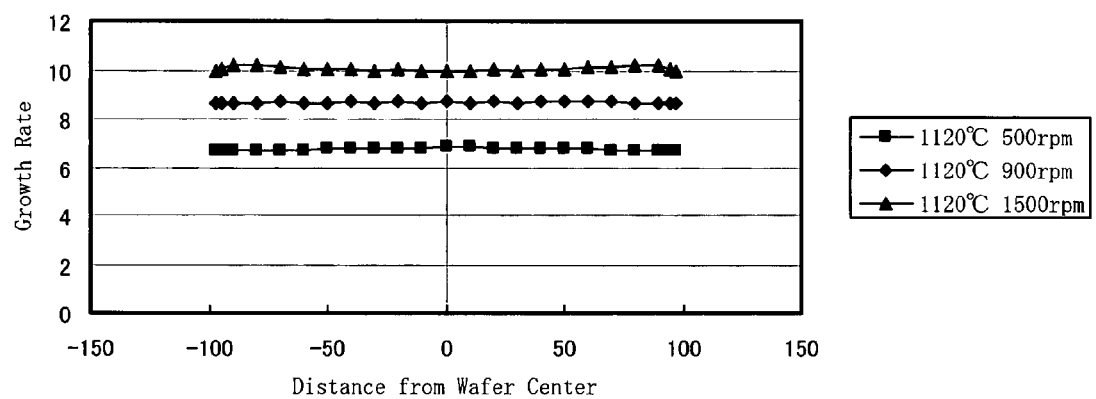
FIG. 37 is a graph showing curves of epitaxial growth rate versus distance from wafer center at varying substrate rotation speeds with the substrate temperature fixed.
Figure 38:
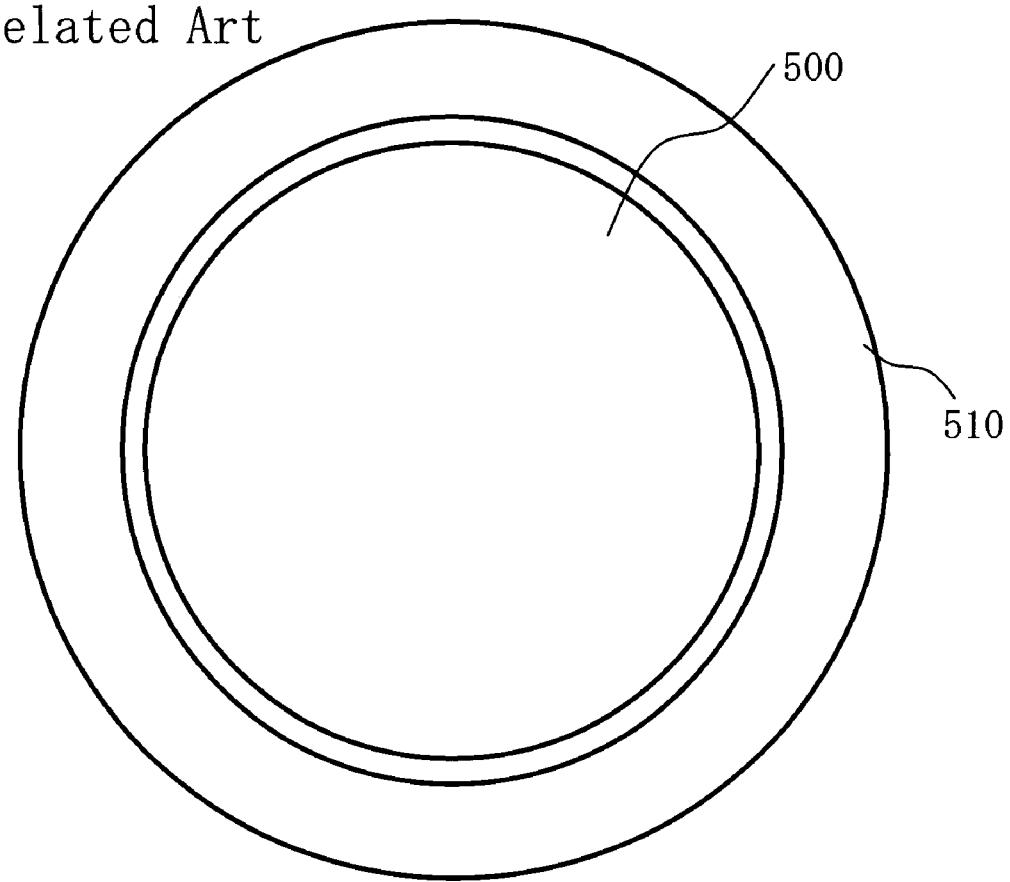
FIG. 38 is a plan view of a holder structure of the type using standard designs for supporting thereon a silicon wafer.
Figure 39:
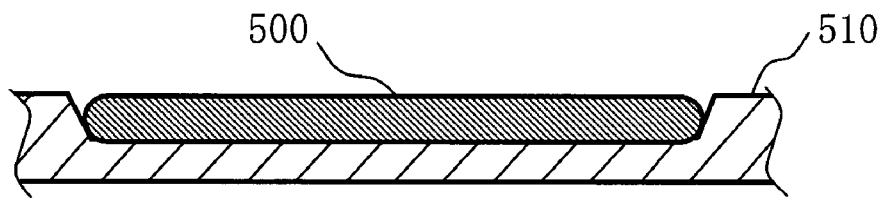
FIG. 39 is a sectional view of the wafer holder shown in FIG. 38.

Turning to FIG. 37, curves of epitaxial growth rate vs. distance from wafer center are plotted, which were measured at a fixed wafer temperature, e.g., 1120° C. while varying the wafer rotation speed. In the process parameters of respective embodiments, the wafer rotation speed was set to fall within a range of from 500 to 1500 $\mathrm{min}^{-1}$ (rpm). In FIG. 37, the growth rate was measured while letting the rotation speed change from a minimal value of such range to an intermediate value and then to a maximal value thereof. As can be seen from this graph, the growth rate is significantly variable between when setting it to the maximum value and when setting to the minimum value. At the maximum and minimum values, the growth rate exhibits variations depending on inplane positions of Si wafer, although these variations are within the allowable range. While the variations are visually seen to be small because the graph of FIG. 37 is different in scale from the FIG. 36 graph, appreciable variations occur between the maximum and minimum value settings. Accordingly, when going out of this range, the growth rate variation becomes larger unacceptably. In the case of the wafer rotation speed being set to the minimum value of 500 rpm at a wafer temperature of 1120° C., the growth rate is equal to 8 μm/min or below. This growth rate reduction is compensable and settable at 8 μm/min by setting the wafer temperature at the maximum value of such rage. Thus, it can be seen that this range is desirable.

It has been stated that it becomes possible to uniformize the thickness of an epitaxial grown semiconductor film on a wafer or substrate by controlling the flow rate and density of reactant and carrier gases, the degree of vacuum in the chamber, substrate temperature and substrate rotation speed. More specifically, as stated previously, use trichlorosilane (SiHCl$_3$) as the reactant gas and hydrogen (H$_2$) as the carrier gas. The concentration of SiHCl$_3$ in the chamber is adjusted at 3% or less. The internal pressure of chamber is set to 8×10$^4$ to 11×10$^4$ Pa. The substrate rotation speed is set to 500 to 1500 rpm. The substrate temperature is set at 1100 to 1140° C. With this combination of process parameters, it is possible to achieve the growth rate of 8 µm/min or greater. After having adjusted them in this way, the semiconductor layer is grown by VPE techniques while enabling its inplane thickness distribution to stay at 5% or less.

According to each of the embodiments stated supra, even when a film grown at sideface part of substrate comes into contact with a film grown at more than one tip end of wafer-positioning projections, it is possible to lessen the area of such film contact, thereby enabling suppression of the substrate's adhesion to the holder. In the case of each projection endface being arranged to have a curved or rounded or sphered surface, the film contact area may be further reduced because of the establishment of line contact or point contact. Thus it is possible to greatly suppress accidental adhesion of the wafer to holder. This also leads to enhanced reducibility of adhesion of the backface of wafer to the holder. Thus it is possible to epitaxially grow the film to an increased thickness—e.g., 50 nm or more.

Although the invention has been disclosed and illustrated with reference to particular embodiments, the principles involved are susceptible for use in numerous other embodiments, modification and alterations which will be apparent to persons skilled in the art to which the invention pertains. For example, while the VPE apparatus shown in FIG. 1 or FIG. 11 is designed to perform epitaxial growth process for forming an epitaxial film, this apparatus is modifiable to grow other kinds of films including, but not limited to, a poly-silicon film on a target wafer.

Although in the description an explanation is eliminated as to components which are not directly relevant to the principles of this invention, these components are arrangeable by use of currently known design schemes on a case-by-case basis. For instance, a system controller for controlling VPE apparatus 100 or 200 is designable by using the presently available techniques in an appropriate way.

Other VPE apparatuses and wafer-supporting structures which comprises the elements of this invention and which are design-changeable by technicians based on the teachings as set forth herein should be interpreted to be involved in the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and equivalents thereto.

What is claimed is:

1. A vapor phase epitaxial growth method using a vapor phase epitaxy apparatus having a chamber, a support structure holding thereon a substrate in the chamber, a first flow path supplying a reactant gas for film formation on the substrate and a second flow path for exhaust of the gas, said method comprising:
    rotating the substrate;
    supplying the reactant gas and a carrier gas to thereby perform vapor-phase epitaxial growth of a semiconductor film on the substrate; and
    during the vapor-phase epitaxial growth of the semiconductor film on the substrate, controlling process parameters to make said semiconductor film uniform in thickness, said process parameters including flow rates and concentrations of the reactant gas and the carrier gas, a degree of vacuum within said chamber, a temperature of the substrate, and a rotation speed of said substrate,
    wherein said reactant gas is trichlorosilane,
    wherein said carrier gas is hydrogen, and
    wherein the trichlorosilane is adjusted to be equal to or less than 8 percent (%) in concentration within said chamber with an internal pressure of said chamber being set at 6.7 to 10.6×10$^4$ pascals (Pa) while setting the rotation speed of the substrate to 500 to 1,500 revolutions per minute (rpm) and the temperature of the substrate to 1,100 to 1,140 degrees centigrade (° C.) to thereby cause said semiconductor layer to grow at a growth rate of 8 micrometers per minute (µm/min) or greater, resulting in an in-plane thickness distribution of said semiconductor layer being less than or equal to 0.5%.

2. The method according to claim 1,
    wherein said support structure has a first recess and a second recess at a bottom of the first recess, and
    wherein said second recess has a depth being less than a thickness of said substrate to thereby uniformize gas flow on said substrate from said first gas flow path, whereby the in-plane thickness distribution of said semiconductor layer is within 0.5%.

3. The method according to claim 1,
    wherein said support structure has a plurality of first raised portions as disposed around the substrate to constrain movement thereof in a substantially horizontal direction being identical to a surface of the substrate and a plurality of second raised portions at surface portions being in contact with said substrate to thereby support said substrate at top faces of the second raised portions, and
    wherein the gases are flowed onto said substrate from said first flow path to ensure that the in-plane thickness distribution of said semiconductor layer is within 0.5%.

4. The method according to claim 1, wherein said support structure has a first recess and a second recess at a bottom of the first recess, said second recess having a depth being less than a thickness of the substrate, a plurality of first raised portions as disposed around the substrate to constrain movement thereof in a substantially horizontal direction being identical to a surface of the substrate, and a plurality of second raised portions at surface portions to be in contact with said substrate for holding said substrate at top faces of said second raised portions, whereby gas flow on said substrate from said first flow path is made uniform so that the in-plane thickness distribution of said semiconductor layer is within 0.5%.

5. The method according to claim 4, wherein the depth of said first recess is less than the thickness of said substrate.

6. The method according to claim 1, wherein said support structure has a plurality of raised portions disposed around the substrate for constraining its movement in a substantially horizontal direction being identical to a surface of said substrate and a surface for holding said substrate as contacted with a back surface of said substrate.

7. The method according to claim 6, wherein said raised portions extend toward a center of the substrate and are sized so that a length of each raised portion extending toward the center is more than twice a thickness of a film to be formed on the substrate surface by use of the reactant gas.

* * * * *